(12) United States Patent
Lee

(10) Patent No.: US 12,112,806 B2
(45) Date of Patent: *Oct. 8, 2024

(54) NONVOLATILE MEMORY DEVICE AND METHOD OF PROGRAMMING IN THE SAME

(71) Applicant: SAMSUNG ELECTRONICS CO., LTD., Suwon-si (KR)

(72) Inventor: Yo-Han Lee, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/205,149

(22) Filed: Jun. 2, 2023

(65) Prior Publication Data

US 2023/0307057 A1 Sep. 28, 2023

Related U.S. Application Data

(63) Continuation of application No. 17/672,122, filed on Feb. 15, 2022, now Pat. No. 11,699,489, which is a
(Continued)

(30) Foreign Application Priority Data

Nov. 7, 2018 (KR) .......................... 10-2018-0135905

(51) Int. Cl.
*G11C 16/10* (2006.01)
*G11C 16/04* (2006.01)
(Continued)

(52) U.S. Cl.
CPC .......... *G11C 16/10* (2013.01); *G11C 16/0483* (2013.01); *G11C 16/08* (2013.01);
(Continued)

(58) Field of Classification Search
CPC ......... G11C 11/10; G11C 11/08; G11C 11/20; G11C 11/24
(Continued)

(56) References Cited

U.S. PATENT DOCUMENTS 6,295,227 B1 * 9/2001 Sakui .................... G11C 16/16
365/185.11
7,924,629 B2 4/2011 Park et al.
(Continued)

FOREIGN PATENT DOCUMENTS

JP 2000-222895 A 8/2000
JP 2013-229070 A 11/2013
(Continued)

OTHER PUBLICATIONS

Communication issued Jun. 30, 2023 by the Korean Intellectual Property Office in counterpart Korean Patent Application No. 10-2018-0135905.
(Continued)

*Primary Examiner* — Sung Il Cho
(74) *Attorney, Agent, or Firm* — Sughrue Mion, PLLC

(57) ABSTRACT

In a method of programming in a nonvolatile memory device including a memory cell region including a first metal pad and a peripheral circuit region including a second metal pad, wherein the peripheral circuit region is vertically connected to the memory cell region by the first metal pad and the second metal pad, a memory block in the memory cell region including a plurality of stacks disposed in a vertical direction is provided where the memory block includes cell strings each of which includes memory cells connected in series in the vertical direction between a source line and each of bitlines. A plurality of intermediate switching transistors disposed in a boundary portion between two adjacent stacks in the vertical direction is provided, where the intermediate
(Continued)

switching transistors perform a switching operation to control electrical connection of the cell strings, respectively. A boosting operation is performed to boost voltages of channels of the plurality of stacks while controlling the switching operation of the intermediate switching transistors during a program operation with respect to the memory block. Program voltage disturbance and pass voltage disturbance are reduced through control of the switching operation of the intermediate switching transistors.

20 Claims, 30 Drawing Sheets

Related U.S. Application Data continuation of application No. 17/007,767, filed on Aug. 31, 2020, now Pat. No. 11,282,575, which is a continuation-in-part of application No. 16/393,377, filed on Apr. 24, 2019, now Pat. No. 10,847,228.

(51) Int. Cl.
*G11C 16/08* (2006.01)
*G11C 16/20* (2006.01)
*G11C 16/24* (2006.01)
*H01L 23/00* (2006.01)
*H01L 25/065* (2023.01)
*H01L 25/18* (2023.01)
*H10B 41/27* (2023.01)
*H10B 43/27* (2023.01)

(52) U.S. Cl.
CPC .............. *G11C 16/20* (2013.01); *G11C 16/24* (2013.01); *H01L 24/05* (2013.01); *H01L 24/08* (2013.01); *H01L 25/0657* (2013.01); *H01L 25/18* (2013.01); *H01L 2224/05147* (2013.01); *H01L 2224/08145* (2013.01); *H01L 2924/1431* (2013.01); *H01L 2924/14511* (2013.01); *H10B 41/27* (2023.02); *H10B 43/27* (2023.02)

(58) Field of Classification Search
USPC ........................................................ 365/145
See application file for complete search history.

(56) References Cited

U.S. PATENT DOCUMENTS

| | | | |
|---|---|---|---|
| 8,194,455 B2* | 6/2012 | Oh ..................... | G11C 16/0483 |
| | | | 365/185.28 |
| 9,171,636 B2 | 10/2015 | Chang et al. | |
| 9,286,987 B1 | 3/2016 | Dong et al. | |
| 9,460,805 B1 | 10/2016 | Pang et al. | |
| 9,466,369 B1 | 10/2016 | Pang et al. | |
| 9,870,825 B2 | 1/2018 | Nam et al. | |
| 11,043,266 B1* | 6/2021 | Tagar ........................ | G11C 7/04 |
| 2007/0040209 A1 | 2/2007 | Spadea | |
| 2012/0120725 A1* | 5/2012 | Ahn ........................ | G11C 16/16 |
| | | | 365/185.02 |
| 2012/0140569 A1* | 6/2012 | Goda ................. | G11C 16/3468 |
| | | | 365/185.19 |
| 2012/0300546 A1 | 11/2012 | Tessariol et al. | |
| 2012/0307561 A1 | 12/2012 | Joo et al. | |
| 2014/0043906 A1 | 2/2014 | Yano | |
| 2015/0092494 A1 | 4/2015 | Rhie | |
| 2016/0049192 A1 | 2/2016 | Lee | |
| 2016/0049201 A1 | 2/2016 | Lue et al. | |
| 2017/0062068 A1* | 3/2017 | Rabkin .............. | G11C 16/3418 |
| 2017/0287566 A1* | 10/2017 | Sabde .................... | G11C 16/14 |
| 2019/0035480 A1 | 1/2019 | Lu et al. | |
| 2019/0221267 A1* | 7/2019 | Ko ...................... | G11C 16/0483 |
| 2019/0267096 A1 | 8/2019 | Yang et al. | |
| 2022/0301628 A1 | 9/2022 | Shim et al. | |

FOREIGN PATENT DOCUMENTS

| | | |
|---|---|---|
| JP | 2019-511802 A | 4/2019 |
| KR | 10-2018-0105906 A | 10/2018 |

OTHER PUBLICATIONS

Communication dated Sep. 29, 2023 issued by the Japanese Intellectual Property Office in counterpart Japanese Application No. 2019-185046.

* cited by examiner

FIG. 13A

| LOOP | LOOP1 | LOOP2 | LOOP3 | LOOP4 | LOOP5 | LOOP6 | LOOP7 |
|---|---|---|---|---|---|---|---|
| VPGM | 15 | 16 | 17 | 18 | 19 | 20 | 21 |
| VPASS2 | 7 | 8 | 9 | 9 | 9 | 9 | 9 |
| VPGM DISTURB | NO | NO | NO | YES | YES | YES | YES |
| VPASS DISTURB | YES | YES | YES | YES | YES | YES | YES |

FIG. 13B

| LOOP | LOOP1 | LOOP2 | LOOP3 | LOOP4 | LOOP5 | LOOP6 | LOOP7 |
|---|---|---|---|---|---|---|---|
| VPGM | 15 | 16 | 17 | 18 | 19 | 20 | 21 |
| VPASS2 | 5 | 6 | 7 | 9 | 9 | 9 | 9 |
| VBST | 2 | 2 | 2 | 2 | 2 | 2 | 2 |
| VPGM DISTURB | NO | NO | NO | NO | NO | YES | YES |
| VPASS DISTURB | NO | NO | YES | YES | YES | YES | YES |

FIG. 19A

T2B(ST3 PROGRAM)

| STRING | | PPC | PBST1 | PBST2 |
|---|---|---|---|---|
| | BL | VINH OR VPER | | |
| | SSL –[ SST | VSOFF | VSOFF | VSON |
| ST3 { WLs (WLu) | WLu –[ MC12 | 0 | 0 | VPASS2 |
| | WLu –[ MC11 | 0 | 0 | VPASS2 |
| | WLu –[ MC10 | 0 | 0 | VPASS2 |
| | WLu –[ MC9 | | | |
| BNDU { | USL –[ MC8 | VUON | VUON | VUOFF |
| | WLu –[ MC7 | | | |
| ST2 { | WLu –[ MC6 | 0 | VPASS1 | VPASS1 |
| | WLu –[ MC5 | | | |
| BNDL { | LSL –[ MC4 | VLON | VLON | VLOFF |
| | WLu –[ MC3 | | | |
| ST1 { | WLu –[ MC2 | 0 | VPASS1 | VPASS1 |
| | WLu –[ MC1 | | | |
| | GSL –[ GST | VGON | VGOFF | VGOFF |
| | CSL | VPC | | |

FIG. 19B

T2B(ST2 PROGRAM)

| STRING | | PPC | PBST1 | PBST2 |
|---|---|---|---|---|
| BL | | VINH OR VPER | | |
| SSL — SST | | VSOFF | VSOFF | VSON |
| ST3 | WLu — MC12 | 0 | 0 | VPASS2 |
| | WLu — MC11 | | | |
| | WLu — MC10 | | | |
| | WLu — MC9 | | | |
| BNDU | USL — MC8 | VUON | VUON | VUOFF |
| ST2 | WLu — MC7 | 0 | 0 | VPASS2 |
| | WLs(WLu) — MC6 | 0 | 0 | VPASS2 |
| | WLu — MC5 | 0 | 0 | VPASS2 |
| BNDL | LSL — MC4 | VLON | VLON | VLOFF |
| ST1 | WLu — MC3 | 0 | VPASS1 | VPASS1 |
| | WLu — MC2 | | | |
| | WLu — MC1 | | | |
| GSL — GST | | VGON | VGOFF | VGOFF |
| CSL | | VPC | | |

NONVOLATILE MEMORY DEVICE AND METHOD OF PROGRAMMING IN THE SAME

CROSS-REFERENCE TO RELATED APPLICATIONS

This application is a continuation of U.S. application Ser. No. 17/672,122 filed on Feb. 15, 2022, now U.S. Pat. No. 11,699,489 issued Jul. 11, 2023, which is a continuation of U.S. application Ser. No. 17/007,767 filed on Aug. 31, 2020, now U.S. Pat. No. 11,282,575 issued Mar. 22, 2022, which is a continuation-in-part application of U.S. application Ser. No. 16/33,377 filed on Apr. 24, 2019, now U.S. Pat. No. 10,847,228 issued Nov. 24, 2020, which claims priority from Korean Patent Application No. 10-2018-0135905, filed on Nov. 7, 2018, in the Korean Intellectual Property Office, the disclosures of which are incorporated herein in their entireties by reference.

BACKGROUND

1. Technical Field

Apparatuses and methods consistent with example embodiments relate to semiconductor integrated circuits, and more particularly to a nonvolatile memory device and a method of programming in a nonvolatile memory device.

2. Discussion of the Related Art

Nonvolatile memory devices may maintain stored data even though power is off. While volatile memory devices are used as main memories of various apparatuses, nonvolatile memory devices are used for storing program codes and/or data in various electronic devices, such as computers, mobile devices, etc.

Recently, nonvolatile memory devices of three-dimensional structure such as vertical NAND memory devices have been developed to increase integration degree and memory capacity of the nonvolatile memory devices. Along with increases in the integration degree and memory capacity, disturbance on memory cells increases while the memory cells are programmed.

SUMMARY

Various example embodiments provide a method of programming in a nonvolatile memory device capable of reducing disturbance on memory cells during a program operation.

The embodiments also provide a nonvolatile memory device capable of reducing disturbance on memory cells during a program operation.

According to an aspect of example embodiments, there is provided a method of programming in a nonvolatile memory device including a memory cell region including a first metal pad and a peripheral circuit region including a second metal pad, wherein the peripheral circuit region is vertically connected to the memory cell region by the first metal pad and the second metal pad. The method may include: providing a memory block in the memory cell region including a plurality of stacks disposed in a vertical direction, each memory block including a plurality of cell strings, and each cell string comprising a plurality of memory cells connected in series in the vertical direction between a source line and each of a plurality of bitlines; providing a plurality of intermediate switching transistors disposed in a boundary portion between two adjacent stacks in the vertical direction, the intermediate switching transistors performing a switching operation to control electrical connection of the cell strings, respectively; and performing a boosting operation to boost voltages of channels of the stacks while controlling the switching operation of the intermediate switching transistors during a program operation with respect to the memory block.

According to an aspect of example embodiments, there is provided a nonvolatile memory device which may include: a memory cell region including a first metal pad; a peripheral circuit region including a second metal pad, wherein the peripheral circuit region is vertically connected to the memory cell region by the first metal pad and the second metal pad; a memory block in the memory cell region, the memory block including a plurality of stacks disposed in a vertical direction, each memory block includes a plurality of cell strings, each cell string includes a plurality of memory cells connected in series in the vertical direction between a source line and each of a plurality of bitlines; a plurality of intermediate switching transistors disposed in a boundary portion between two adjacent stacks in the vertical direction, the intermediate switching transistors performing a switching operation to control electrical connection of the cell strings, respectively; and a control circuit in the peripheral circuit region, the control circuit configured to perform a boosting operation to boost voltages of channels of the stacks while controlling the switching operation of the intermediate switching transistors during a program operation with respect to the memory block.

The nonvolatile memory device and the method of programming in the nonvolatile memory device according to example embodiments may reduce program voltage disturbance and pass voltage disturbance, and thus, may enhance performance and lifetime of the nonvolatile memory device through control of the switching operation of the intermediate switching transistors to implement double boosting of the channel voltages.

BRIEF DESCRIPTION OF THE DRAWINGS

Example embodiments of the present disclosure will be more clearly understood from the following detailed description taken in conjunction with the accompanying drawings.

FIGS. 13A and 13B are diagrams for describing decreases in pass voltage disturbance and program voltage disturbance in incremental step pulse programming (ISPP) of a nonvolatile memory device, according to example embodiments.

FIGS. 19A and 19B are diagrams illustrating a program operation with respect to stacks of the memory cell array of FIG. 18 according to the first program scenario of FIG. 10, according to example embodiments.

DETAILED DESCRIPTION OF THE EMBODIMENTS

The embodiments described herebelow are all exemplary, and thus, the inventive concept is not limited to these embodiments disclosed below and may be realized in various other forms. Various embodiments will be described more fully hereinafter with reference to the accompanying drawings, in which like numerals refer to like elements throughout. Repeated descriptions may be omitted.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. As used herein, the term "and/or" includes any and all combinations of one or more of the associated listed items.

Spatially relative terms, such as "beneath," "below," "lower," "over," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Figure 1:
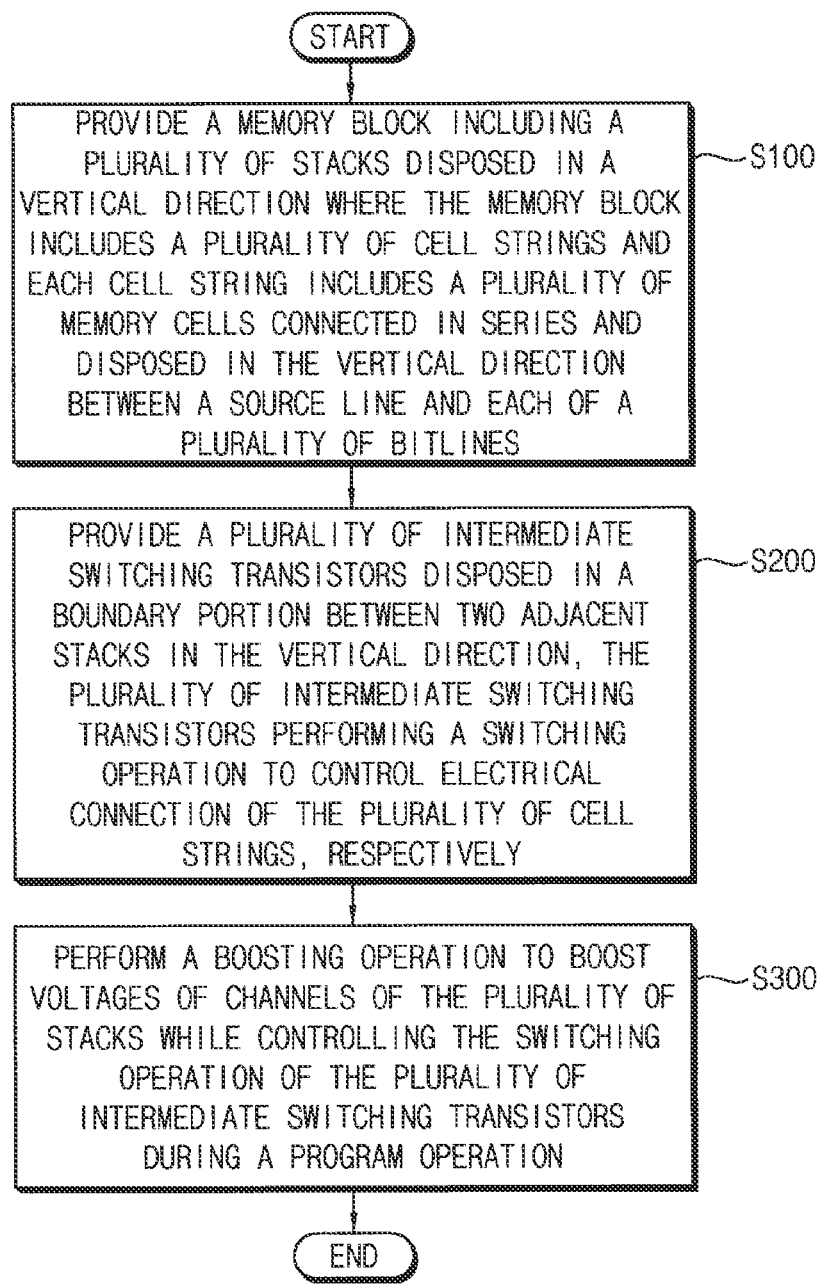
FIG. 1 is a flow chart illustrating a method of programming in a nonvolatile memory device, according to example embodiments.

FIG. 1 is a flow chart illustrating a method of programming in a nonvolatile memory device according to embodiments.

Referring to FIG. 1, a memory block including a plurality of stacks disposed in a vertical direction is provided, wherein the memory block includes a plurality of cell strings, and each cell string includes a plurality of memory cells connected in series and disposed in the vertical direction between a source line and a plurality of bitlines (S100). The memory block or a memory cell array may be divided into two stacks as will be described below with reference to FIGS. 7A, 7B and 7C, three stacks as will be described below with reference to FIG. 18, and in the same way four or more stacks.

Figure 5:
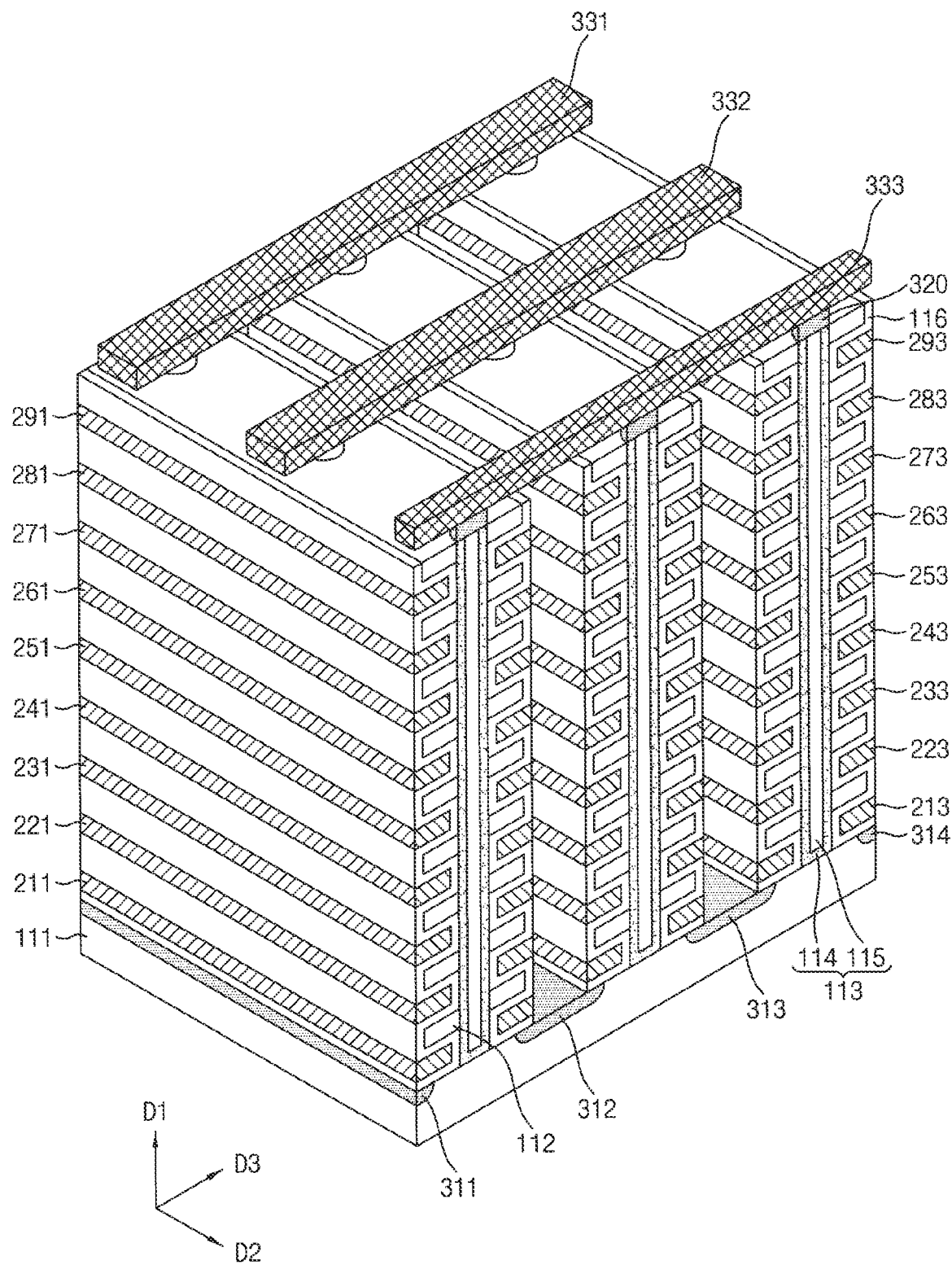
FIG. 5 is a perspective view illustrating one of memory blocks of FIG. 4.
Figure 6:
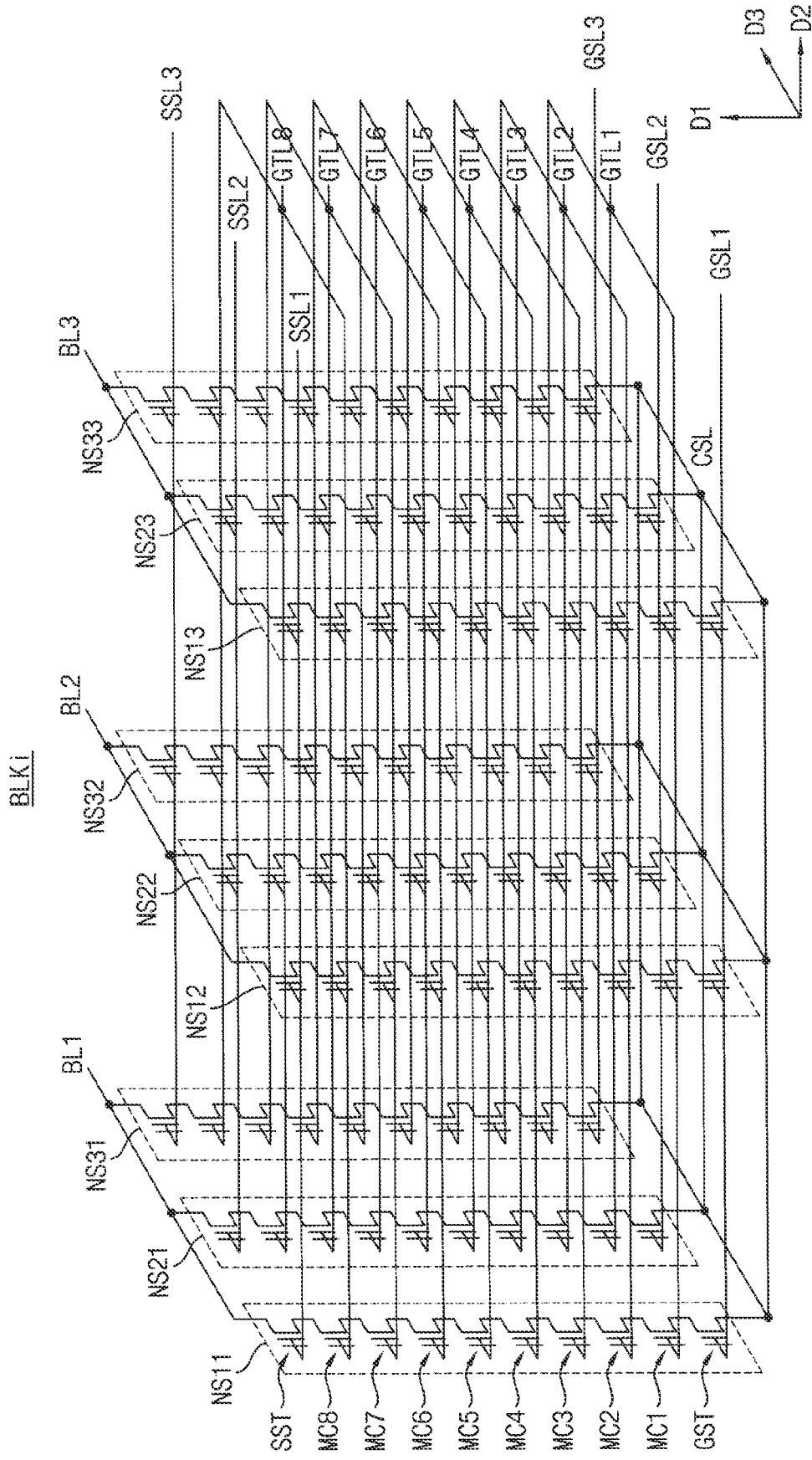
FIG. 6 is a circuit diagram illustrating an equivalent circuit of the memory block described with reference to FIG. 5.

A plurality of intermediate switching transistors disposed in a boundary portion between two adjacent stacks in the vertical direction are provided, wherein the plurality of intermediate switching transistors perform a switching operation to control electrical connection of the plurality of cell strings, respectively (S200). In some embodiments, as will be described below with reference to FIGS. 7A and 7B, the boundary portion may correspond to one gate layer. In other embodiments, as will be described below with reference to FIG. 7C, the boundary portion may correspond to two or more gate layers that are adjacent in the vertical direction. In still other embodiments, as will be described below with reference to FIG. 18, the boundary portion may correspond to two or more gate layers that are spaced apart in the vertical direction. Here, the gate layers may be layers on which conductive materials 213 to 293 in FIG. 5 are formed, that is, gate layers in which gate lines GTL1-GTL8 in FIG. 6 are formed.

A boosting operation is performed to boost voltages of channels of the plurality of stacks while controlling the switching operation of the plurality of intermediate switching transistors during a program operation (S300). The boosting operation according to the control of the switching operation of the plurality of intermediate switching transistors will be described below with reference to FIG. 11, and so on.

As the number of the wordlines formed in the gate layers stacked in the vertical direction is increased to grow the density of each memory block, pass voltage disturbance on the memory cells connected to the unselected wordlines during the program operation is increased. Also program voltage disturbance on memory cells connected to a selected wordline but included in unselected cell strings is increased as the number of cell strings in each memory block is increased.

The nonvolatile memory device and the method of programming in the nonvolatile memory device according to embodiments may reduce program voltage disturbance and pass voltage disturbance, and thus, may enhance performance and lifetime of the nonvolatile memory device through control of the switching operation of the intermediate switching transistors to implement double boosting of the channel voltages. Here the double boosting indicates that the channel voltages of a selected stack that is to be programmed is boosted twice by controlling the switching operation of the intermediate switching transistors and timing of applying pass voltages to the respective stacks.

Figure 2:
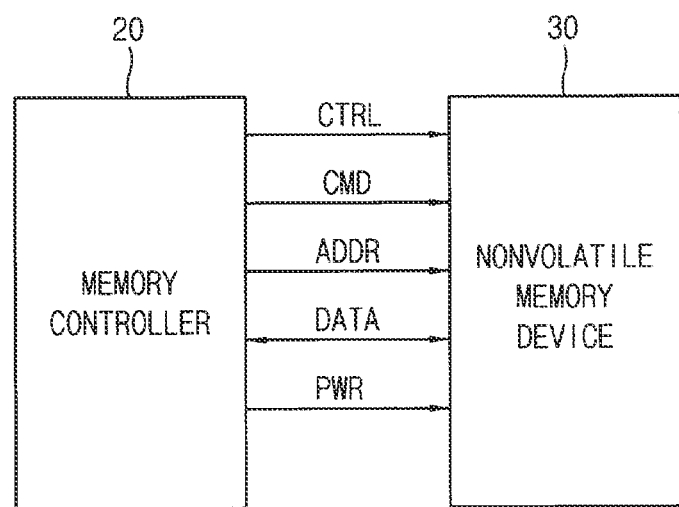
FIG. 2 is a block diagram illustrating a memory system according to example embodiments.

FIG. 2 is a block diagram illustrating a memory system according to embodiments.

Referring to FIG. 2, a memory system 10 may include a memory controller 20 and at least one memory device 30.

The memory device 30 may be a nonvolatile memory device as described herein. The memory system 10 may include data storage media based on a flash memory such as a memory card, a universal serial bus (USB) memory and a solid state drive (SSD).

The nonvolatile memory device 30 may perform a read operation, an erase operation, and a program operation or a write operation under control of the memory controller 20. The nonvolatile memory device 30 receives a command CMD, an address ADDR and data DATA through input/output lines from the memory controller 20 for performing such operations. In addition, the nonvolatile memory device 30 receives a control signal CTRL through a control line from the memory controller 20. In addition, the nonvolatile memory device 30 receives a power PWR through a power line from the memory controller 20.

Figure 3:
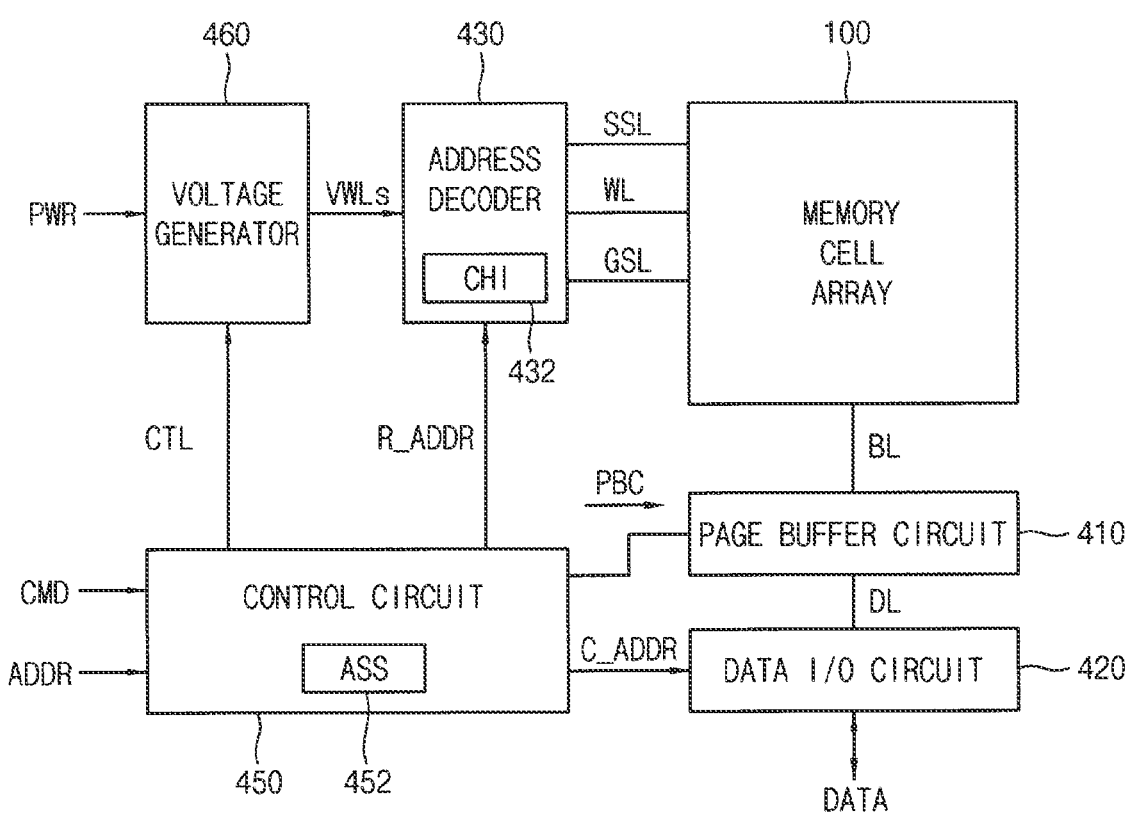
FIG. 3 is a block diagram illustrating an example embodiment of a nonvolatile memory device included in the memory system of FIG. 2.

FIG. 3 is a block diagram illustrating an embodiment of a nonvolatile memory device included in the memory system of FIG. 2.

Referring to FIG. 3, the nonvolatile memory device 30 includes a memory cell array 100, a page buffer circuit 410, a data input/output circuit 420, an address decoder 430, a control circuit 450 and a voltage generator 460.

The memory cell array 100 may be coupled to the address decoder 430 through a plurality of string selection lines SSL, a plurality of wordlines WL, and a plurality of ground selection lines GSL. In addition, the memory cell array 100 may be coupled to the page buffer circuit 410 through a plurality of bitlines BL.

The memory cell array 100 may include a plurality of memory cells coupled to the plurality of wordlines WL and the plurality of bitlines BL. In some embodiments, the memory cell array 100 may be a three-dimensional memory cell array, which is formed on a substrate in a three-dimensional structure (or a vertical structure). In this case, the memory cell array 100 may include a plurality of NAND strings that are vertically oriented such that at least one memory cell is located over another memory cell.

The control circuit 450 may receive a command (signal) CMD and an address (signal) ADDR from the memory controller 20. The control circuit 450 may control erase, programming and read operations of the nonvolatile memory device 30 based on the command signal CMD and the address signal ADDR. An erasure operation may include performing a sequence of erase loops, and a program operation may include performing a sequence of program loops. Each program loop may include a program operation and a program verification operation. Each erase loop may include an erase operation and an erase verification operation. The read operation may include a normal read operation and a data recovery read operation.

For example, the control circuit 450 may generate control signals CTL, which are used for controlling the voltage generator 460, generate a page buffer control signal PBC for controlling the page buffer circuit 410, based on the command signal CMD, and generate a row address R_ADDR and a column address C_ADDR based on the address signal ADDR. The control circuit 450 may provide the row address R_ADDR to the address decoder 430 and provide the column address C_ADDR to the data input/output circuit 420.

The address decoder 430 may be coupled to the memory cell array 100 through the plurality of string selection lines SSL, the plurality of wordlines WL, and the plurality of ground selection lines GSL. During the program operation or the read operation, the address decoder 430 may determine one of the plurality of wordlines WL as a selected wordline and determine the rest of the plurality of wordlines WL, except for the selected wordline, as unselected wordlines, based on the row address R_ADDR.

In addition, during the program operation or the read operation, the address decoder 430 may determine one of the plurality of string selection lines SSL as a selected string selection line, and determine the rest of the plurality of string selection lines SSL except for the selected string selection line as unselected string selection lines based on the row address R_ADDR.

The voltage generator 460 may generate wordline voltages VWL, which may be needed for the operation of the memory cell array 100 of the nonvolatile memory device 30, based on the control signals CTL. The voltage generator 460 may receive the power PWR from the memory controller 20. The wordline voltages VWL may be applied to the plurality of wordlines WL through the address decoder 430.

For example, during the program operation, the voltage generator 460 may apply a program voltage to the selected wordline, and apply a program pass voltage to the unselected wordlines. In addition, during the program verification operation, the voltage generator 460 may apply a program verification voltage to the selected wordline, and apply a verification pass voltage to the unselected wordlines. In addition, during the normal read operation, the voltage generator 460 may apply a read voltage to the selected wordline, and apply a read pass voltage to the unselected wordlines.

The page buffer circuit 410 may be coupled to the memory cell array 100 through the plurality of bitlines BL. The page buffer circuit 410 may include a plurality of buffers. In some embodiments, each buffer may be connected to one bitline. In other embodiments, each buffer may be connected to two or more bitlines.

The page buffer circuit 410 may temporarily store data to be programmed in a selected page or data read out from the selected page of the memory cell array 100.

The data input/output circuit 420 may be coupled to the page buffer circuit 410 through data lines DL. During the program operation, the data input/output circuit 420 may receive program data DATA received from the memory controller 20, and provide the program data DATA to the page buffer circuit 410 based on the column address C_ADDR received from the control circuit 450. During the read operation, the data input/output circuit 420 may provide read data DATA, having been read from the memory cell array 100 and stored in the page buffer circuit 410, to the memory controller 20 based on the column address C_ADDR received from the control circuit 450.

The address decoder 430 may include a channel initializer CHI 432. In general, channel initialization is performed through the string selection line SSL and the bitline BL connected to a cell string. However, when a memory cell adjacent to a string selection transistor is programmed first, the channel initialization or channel precharge may not be performed through the string selection transistor and the bitline SSL. The channel initializer 432 may determine a proper program order and perform the channel initialization based on the program order. For example, the channel initializer 432 may determine time points of applying the voltages to the string selection line SSL, the ground selection line GSL and a common source line.

The control circuit 450 may include an address scramble selector ASS 452. The address scramble selector 452 may store channel hole profile information about the cell strings included in the memory cell array 100. The channel hole profile may be defined during the manufacturing stage of the nonvolatile memory device 30. The address scramble selector 452 may select a wordline WL corresponding to a received address ADDR among a plurality of wordlines WL based on the channel hole profile information. The address scramble indicates a method of mapping memory cells included in a cell string to the wordlines WL.

Hereinafter, a first direction D1 indicates a direction perpendicular to an upper surface of a semiconductor substrate, and a second direction D2 and a third direction D3 indicate two directions parallel to the upper surface of the semiconductor substrate. For example, the second direction D2 and the third direction D3 may be perpendicular to each other. The first direction D1 may be referred to as a vertical direction, the second direction D2 may be referred to as a row direction and the third direction D3 may be referred to as a column direction. The direction indicated by an arrow in figures and the opposite direction may be considered as the same direction.

Figure 4:
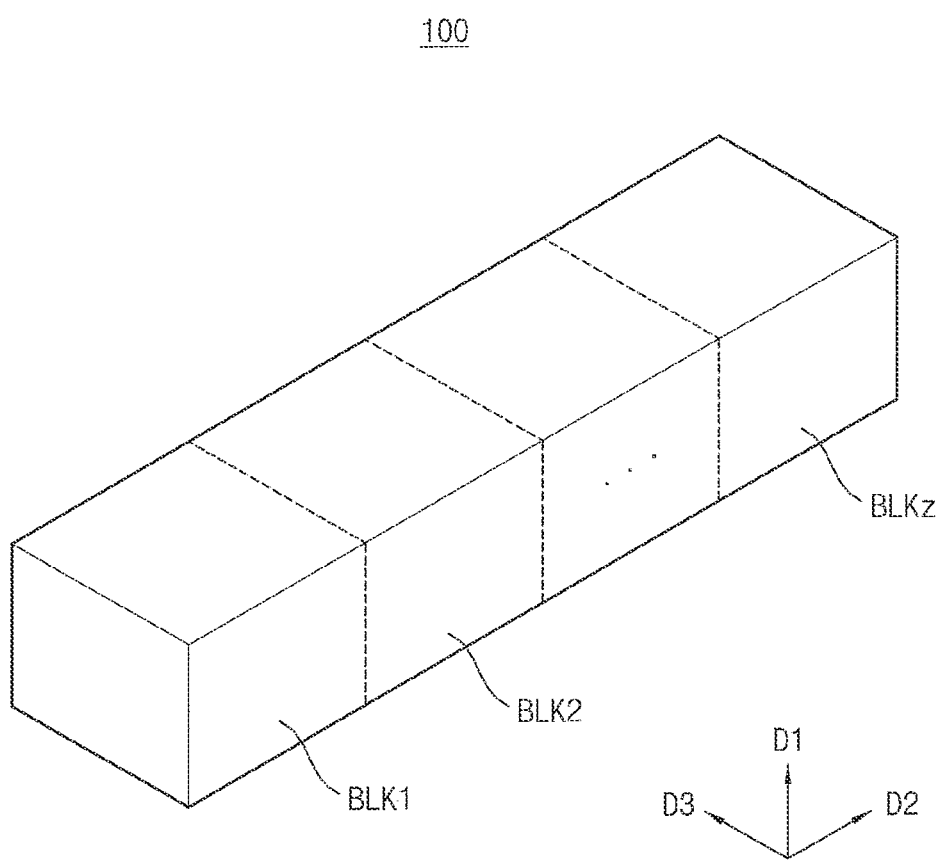
FIG. 4 is a block diagram illustrating a memory cell array included in the nonvolatile memory device of FIG. 3.

FIG. 4 is a block diagram illustrating a memory cell array included in the nonvolatile memory device of FIG. 3, and FIG. 5 is a perspective view illustrating one of memory blocks of FIG. 4.

Referring to FIG. 4, the memory cell array 100 may include a plurality of memory blocks BLK1 to BLKz. In an embodiment, the memory blocks BLK1 to BLKz are selected by the address decoder 430 in FIG. 3. For example, the address decoder 430 may select a particular memory block BLK corresponding to a block address among the memory blocks BLK1 to BLKz.

Referring to FIG. 5, a memory block BLKi includes NAND strings or cell strings which are formed on a substrate in a three-dimensional structure (or a vertical structure). The memory block BLKi includes structures extending along the first, second and third directions D1, D2 and D3.

A substrate 111 is provided. For example, the substrate 111 may have a well of a first type (e.g., a first conductive type). For example, the substrate 111 may have a p-well formed by implanting a group 13 element such as boron (B). For example, the substrate 111 may have a pocket p-well provided in an n-well. In an embodiment, the substrate 111 has a p-type well (or a p-type pocket well). However, the conductive type of the substrate 111 is not limited to the p-type.

A plurality of doping regions 311 to 314 extending along the second direction D2 are provided in/on the substrate 111. For example, the plurality of doping regions 311 to 314 may have a second type (e.g., a second conductive type) different from the first type of the substrate 111. In an embodiment, the first to fourth doping regions 311 to 314 have an n-type. However, the conductive type of the first to fourth doping regions 311 to 314 is not limited to the n-type.

A plurality of insulation materials 112 extending along the second direction D2 are sequentially provided along the first direction D1 on a region of the substrate 111 between the first and second doping regions 311 and 312. For example, the plurality of insulation materials 112 are provided along the first direction D1, being spaced by a specific distance. For example, the insulation materials 112 may include an insulation material such as an oxide layer.

A plurality of pillars 113 penetrating the insulation materials along the first direction D1 are sequentially disposed along the second direction D2 and the third direction D3 on a region of the substrate 111. For example, the plurality of pillars 113 penetrate the insulation materials 112 to contact the substrate 111.

For example, each pillar 113 may include a plurality of materials. For example, a channel layer 114 of each pillar 113 may include a silicon material having a first type. For example, the channel layer 114 of each pillar 113 may include a silicon material having the same type as the substrate 111. In an embodiment, the channel layer 114 of each pillar 113 includes p-type silicon. However, the channel layer 114 of each pillar 113 is not limited to the p-type silicon.

An internal material 115 of each pillar 113 includes an insulation material. For example, the internal material 115 of each pillar 113 may include an insulation material such as silicon oxide. In some examples, the inner material 115 of each pillar 113 may include an air gap.

An insulation layer 116 is provided along the exposed surfaces of the insulation materials 112, the pillars 113, and the substrate 111, on a region between the first and second doping regions 311 and 312.

A plurality of first conductive materials 211 to 291 are provided on surfaces of the insulation layer 116, in a region between the first and second doping regions 311 and 312. For example, the first conductive material 211 extending along the second direction D2 is provided between the insulation material 112 adjacent to the substrate 111 and the substrate 111. In more detail, the first conductive material 211 extending along the second direction D2 is provided between the insulation layer 116 at the bottom of the insulation material 112 adjacent to the substrate 111 and the substrate 111.

A first conductive material extending along the second direction D2 is provided between the insulation layer 116 at the top of a specific insulation material among the insulation materials 112 and the insulation layer 116 at the bottom of a specific insulation material among the insulation materials 112. For example, a plurality of first conductive materials 221 to 281 extending along the second direction D2 are provided between the insulation materials 112, and it may be understood that the insulation layer 116 is provided between the insulation materials 112 and the first conductive materials 221 to 281. The first conductive materials 211 to 291 may be formed of a conductive metal. In some examples, the first conductive materials 211 to 291 may include a conductive material such as polysilicon.

The same structures as those on the first and second doping regions 311 and 312 may be provided in a region between the second and third doping regions 312 and 313. In the region between the second and third doping regions 312 and 313, provided are a plurality of insulation materials 112 extending along the second direction D2, a pillar 113 penetrating the plurality of insulation materials 112 along the first direction D1, an insulation layer 116 provided on the exposed surfaces of the plurality of insulation materials 112 and the pillar 113, and a plurality of conductive materials 213 to 293 extending along the second direction D2.

Drains 320 are provided on the plurality of pillars 113, respectively. On the drains 320, second conductive materials 331 to 333 extending along the third direction D3 are provided. The second conductive materials 331 to 333 are disposed along the second direction D2, being spaced by a specific distance. The second conductive materials 331 to 333 are respectively connected to the drains 320 in a corresponding region. The drains 320 and the second conductive material 331 to 333 extending along the third direction D3 may be connected through each contact plug. The second conductive materials 331 to 333 may include metal materials. The second conductive materials 331 to 333 may include conductive materials such as polysilicon.

The layers in which the first conductive materials are formed correspond to gate layers and the first conductive materials may form gate lines such as a string selection line SSL, a wordline WL, intermediate switching lines MSL, USL and LSL, a ground selection line GSL, etc. The second conductive materials may form a bitline BL.

FIG. 6 is a circuit diagram illustrating an equivalent circuit of the memory block described with reference to FIG. 5.

The memory block BLKi of FIG. 6 may be formed on a substrate in a three-dimensional structure (or a vertical structure). For example, a plurality of NAND strings or cell strings included in the memory block BLKi may be formed in the first direction D1 perpendicular to the upper surface of the substrate.

Referring to FIG. 6, the memory block BLKi may include NAND strings NS11 to NS33 coupled between bitlines BL1, BL2 and BL3 and a common source line CSL. Each of the NAND strings NS11 to NS33 may include a string selection transistor SST, a plurality of memory cells MC1 to MC8, and a ground selection transistor GST. In FIG. 6, each of the NAND strings NS11 to NS33 is illustrated to include eight memory cells MC1 to MC8. However, embodiments are not limited thereto. In some embodiments, each of the NAND strings NS11 to NS33 may include any number of memory cells.

Each string selection transistor SST may be connected to a corresponding string selection line (one of SSL1 to SSL3). The plurality of memory cells MC1 to MC8 may be connected to corresponding gate lines GTL1 to GTL8, respectively. The gate lines GTL1 to GTL8 may be wordlines and some of the gate lines GTL1 to GTL8 may be dummy wordlines. In addition, some of the gate lines GTL1 to GTL8 may be intermediate switching lines, and the memory cells connected to the intermediate switching lines may be referred to as intermediate switching transistors or intermediate switches. Each ground selection transistor GST may be connected to a corresponding ground selection line (one of GSL1 to GSL3). Each string selection transistor SST may be connected to a corresponding bitline (e.g., one of BL1, BL2 and BL3), and each ground selection transistor GST may be connected to the common source line CSL.

Wordlines (e.g., WL1) having the same height may be commonly connected, and the ground selection lines GSL1 to GSL3 and the string selection lines SSL1 to SSL3 may be separated. Even though not illustrated, the gate lines corresponding to the intermediate switching lines may be separated as will be described below. In FIG. 6, the memory block BLKi is illustrated to be coupled to eight gate lines GTL1 to GTL8 and three bitlines BL1 to BL3. However, embodiments are not limited thereto. Each memory block in the memory cell array 100 may be coupled to any number of wordlines and any number of bitlines.

Hereinafter, the memory cells may be omitted and only the gate lines stacked in the vertical direction may be illustrated in figures of a memory block for convenience of illustration. The gate lines may include a string selection line SSL, a wordline WL, a dummy wordline DWL, intermediate switching lines MSL, USL and LSL and a ground selection line GSL. The transistors driven by the intermediate switching lines MSL, USL and LSL may be referred to as intermediate switching transistors or intermediate switches. At least one of the intermediate switching lines MSL, USL and LSL may be also a dummy wordline DWL, and at least one of the respectively connected intermediate switching transistors may be a dummy transistor which is not connected to the bitlines BL. For convenience of illustration and description, only two, three or four cell strings are connected to a same bitline BL in following figures. However, embodiments are not limited thereto, and the number of cell strings may be determined variously.

Figure 7A:
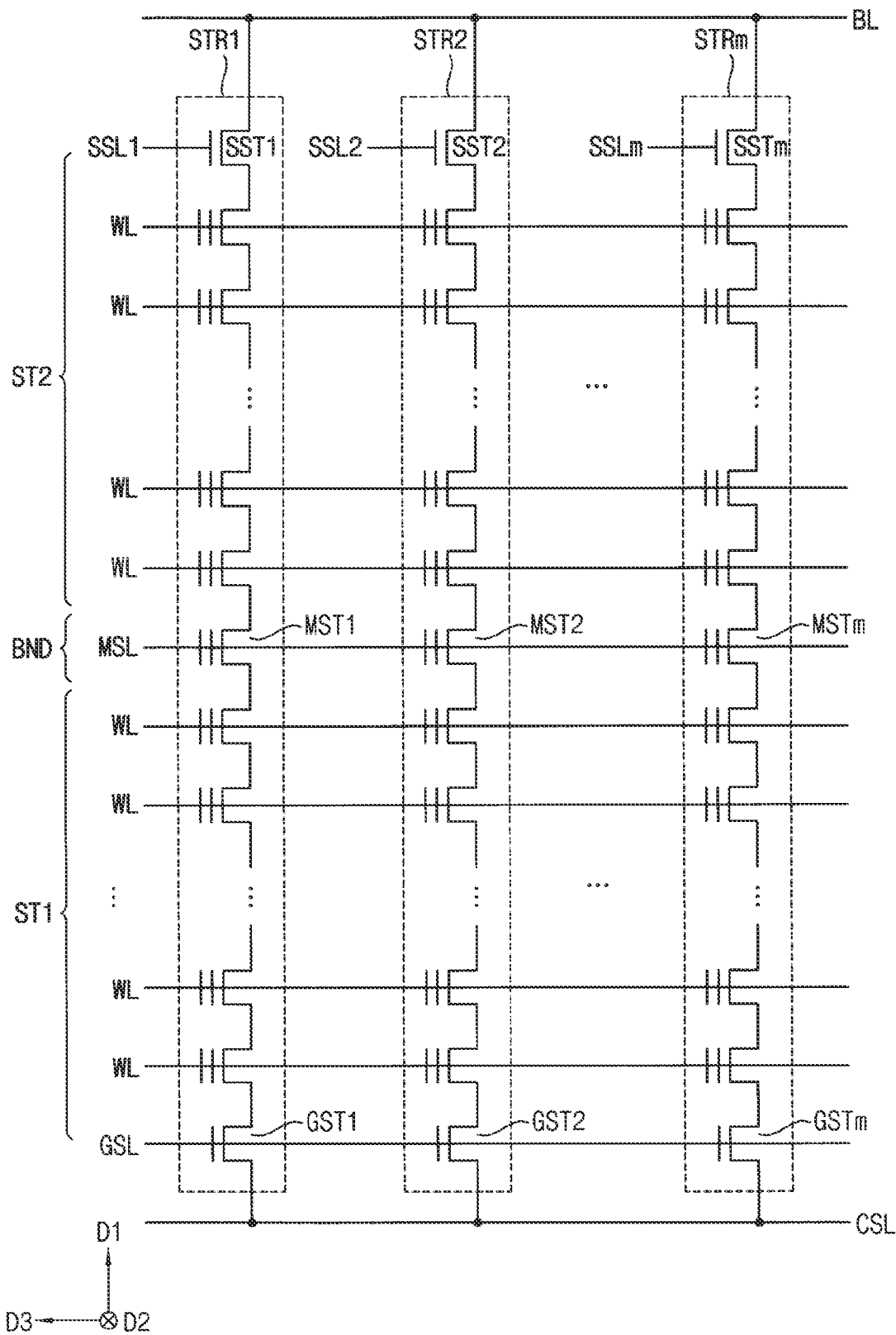
FIG. 7A is a circuit diagram illustrating a structure of a memory cell array according to example embodiments.

FIG. 7A is a circuit diagram illustrating a structure of a memory cell array according to embodiments.

Figure 7B:
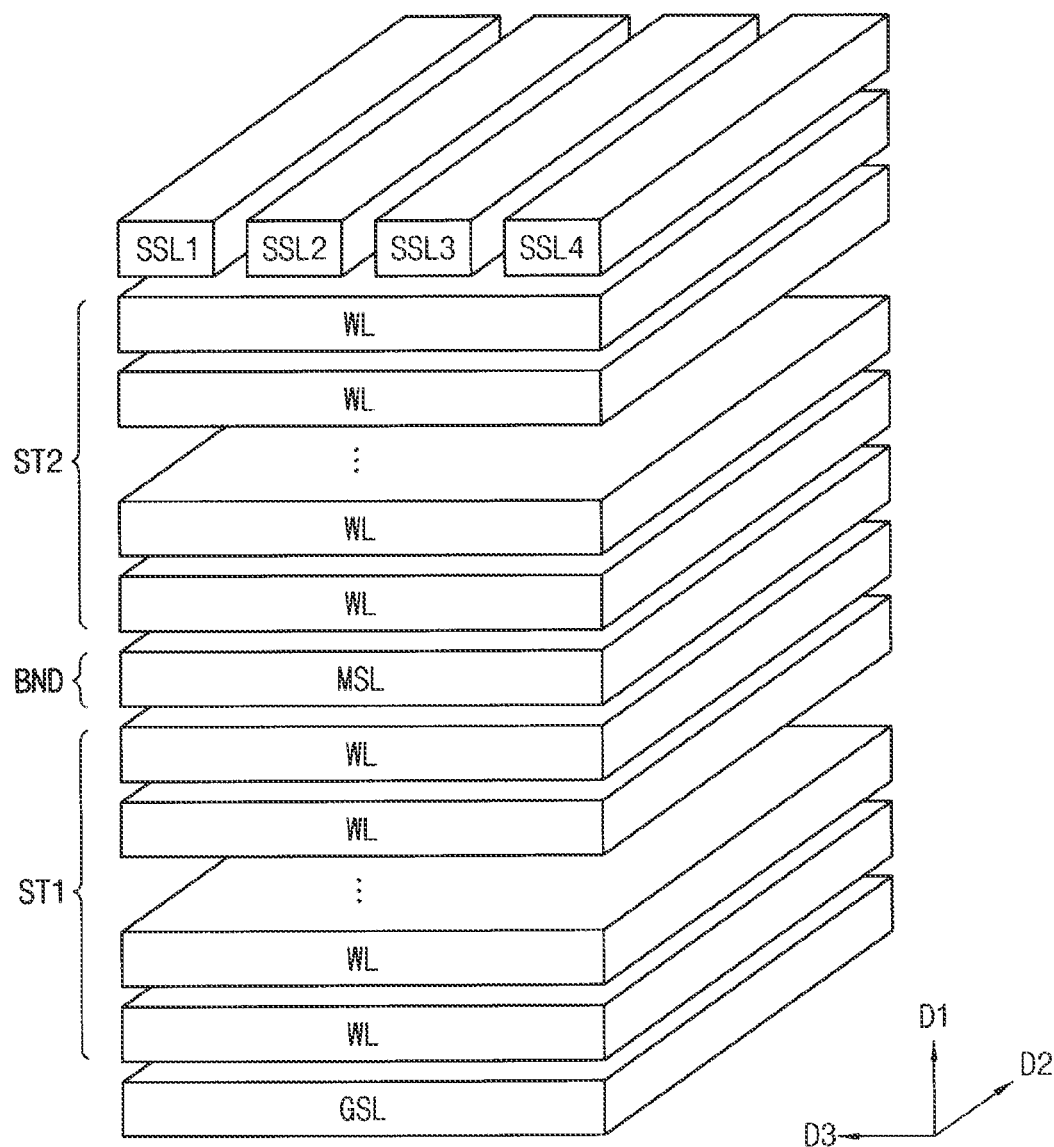
FIGS. 7B and 7C are perspective views illustrating a memory block corresponding to a structure of FIG. 7A.
Figure 7C:
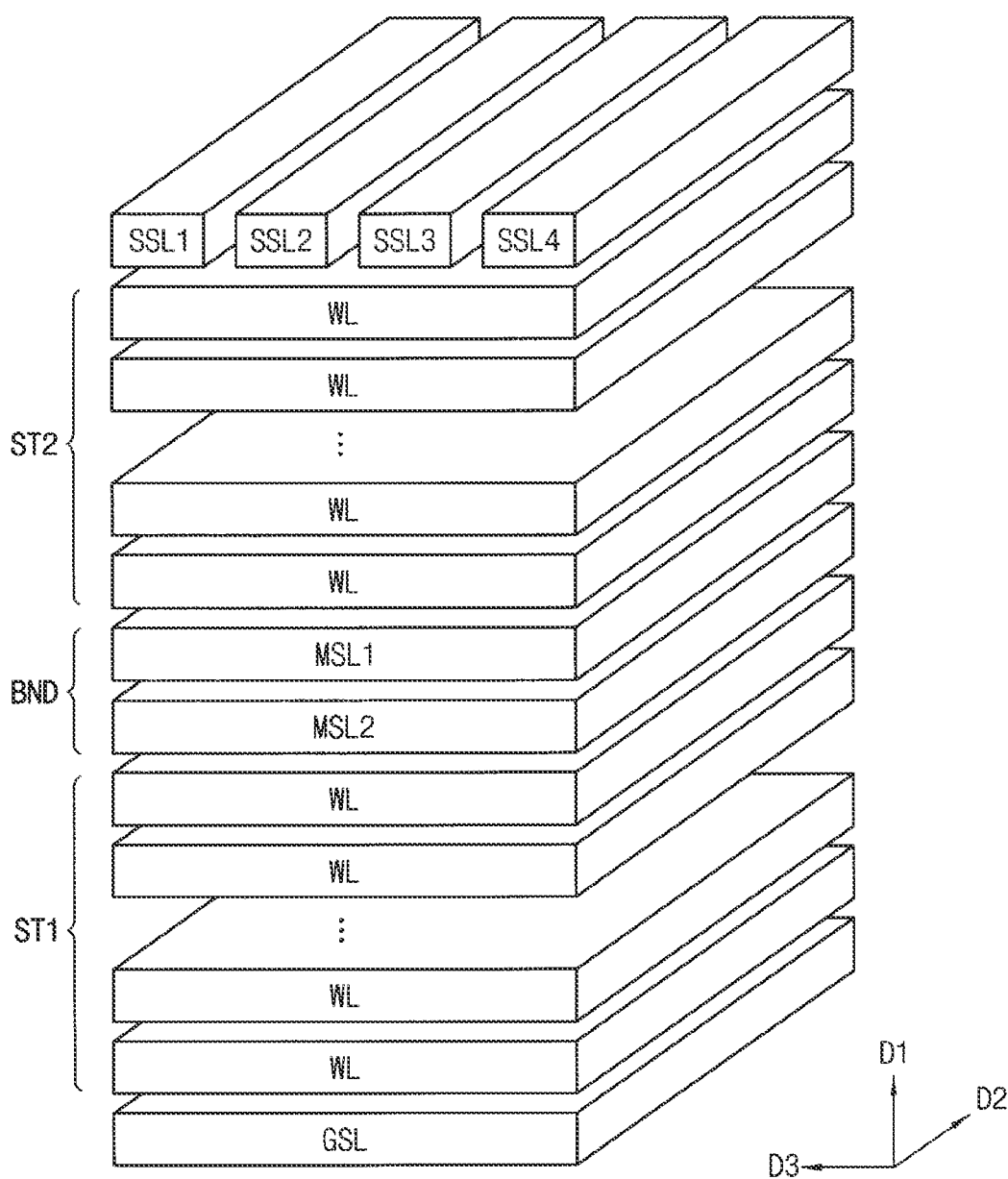

FIGS. 7B and 7C are perspective views illustrating a memory block corresponding to a structure of FIG. 7A.

FIG. 8A illustrates two-dimensional version of a memory block including cell strings connected to one bitline BL and one source line CSL for convenience of illustration, but it will be understood that the memory block may have a three-dimensional structure of a plurality of bitlines as described with reference to FIGS. 5 and 6.

Referring to FIGS. 7A and 7B, a memory block may include a plurality of cell strings STR1-STRm connected between a bitline BL and a source line CSL. The cell strings STR1-STRm may include two stacks ST1 and ST2, and a boundary portion BND therebetween. The cell strings STR1-STRm may include string selection transistors SST1-SSTm controlled by string selection lines SSL1-SSLm, memory cells controlled by wordlines WL, intermediate switching transistors MST1-MSTm controlled by an intermediate switching line MSL, and a ground selection transistors GST1-GSTm controlled by a ground selection line GSL, respectively. Here, m is a natural number greater than 1. The intermediate switching line MSL may be a dummy wordline DWL, and the intermediate switching transistors MST1-MSTm may be dummy transistors which are not connected to the bitlines BL. The memory cells connected to wordlines disposed in end portions of the stacks ST1 and ST2 in the first direction D1 may be dummy cells.

FIG. 7A illustrates an embodiment that the ground selection transistors GST1-GSTm are connected to the same ground selection line GSL. In other embodiments, the ground selection transistors may be connected to the respective ground selection lines.

In some embodiments, as illustrated in FIGS. 7A and 7B, the boundary portion BND may include one gate line MSL that switches or activates simultaneously the intermediate switching transistors MST1-MSTm connected thereto. In other embodiments, as illustrated in FIG. 7C, the boundary portion BND may include two gate lines MSL1 and MSL2 that switch simultaneously the intermediate switching transistors connected thereto. Even though not illustrated in figures, the boundary portion BND may include three or more gate lines.

Figure 8:
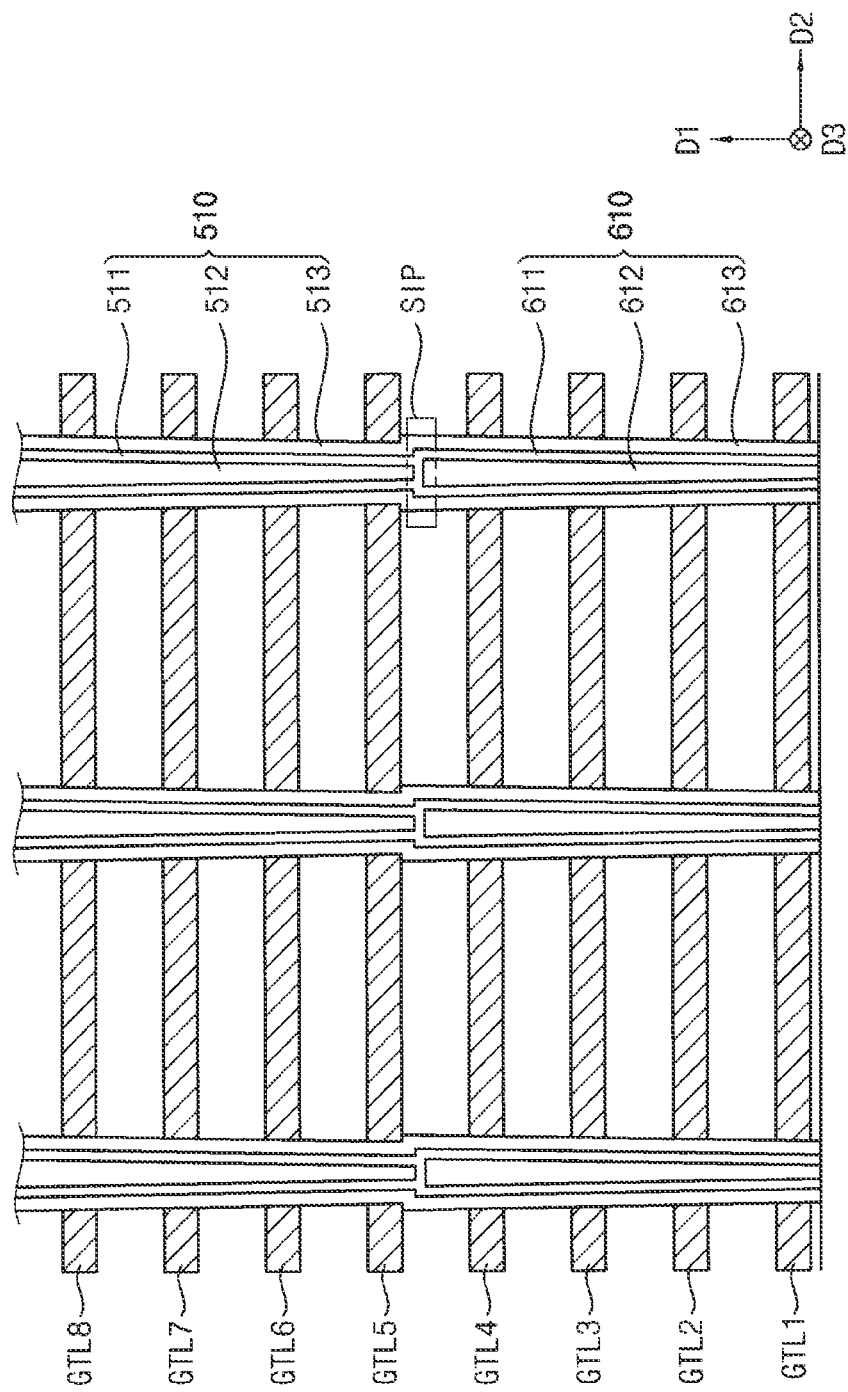
FIG. 8 is a cross-sectional view for describing an example embodiment of a boundary portion included in a memory block according to example embodiments.

FIG. 8 is a cross-sectional view for describing an embodiment of a boundary portion included in a memory block according to embodiments.

Referring to FIG. 8, a channel hole of each cell string STR may include a first sub channel hole 610 and a second sub channel hole 510. A channel hole may be referred to as a pillar corresponding to the pillar 113 shown in FIG. 5. The first sub channel hole 610 may include a channel layer 611, an inner material 612 and an insulation layer 613. The second sub channel hole 510 may include a channel layer 511, an inner material 512 and an insulation layer 513. The channel layer 611 of the first channel hole 610 may be connected to the channel layer 511 of the second sub channel hole 510 through a P-type silicon pad SIP. The sub channel holes 610 and 510 may be formed using a stopper line GTL5 having an appropriate etch rate. For example, the stopper line GTL5 may be formed of polysilicon and the other gate lines GTL1-GTL4 and the GTL6-GTL8 may be formed of metal such as tungsten to implement the appropriate etch rate.

The above-described boundary portion BND may correspond to the stopper layer GTL5 that is used to form the plurality of sub channel holes. The cells in the stopper layer GTL5 may be improper for storing data, and the stopper layer may be used as the boundary portion BND to form the intermediate switching transistors. Embodiments are not limited to a boundary portion of one stopper layer, and the boundary portion may include two or more gate layers.

Figure 9:
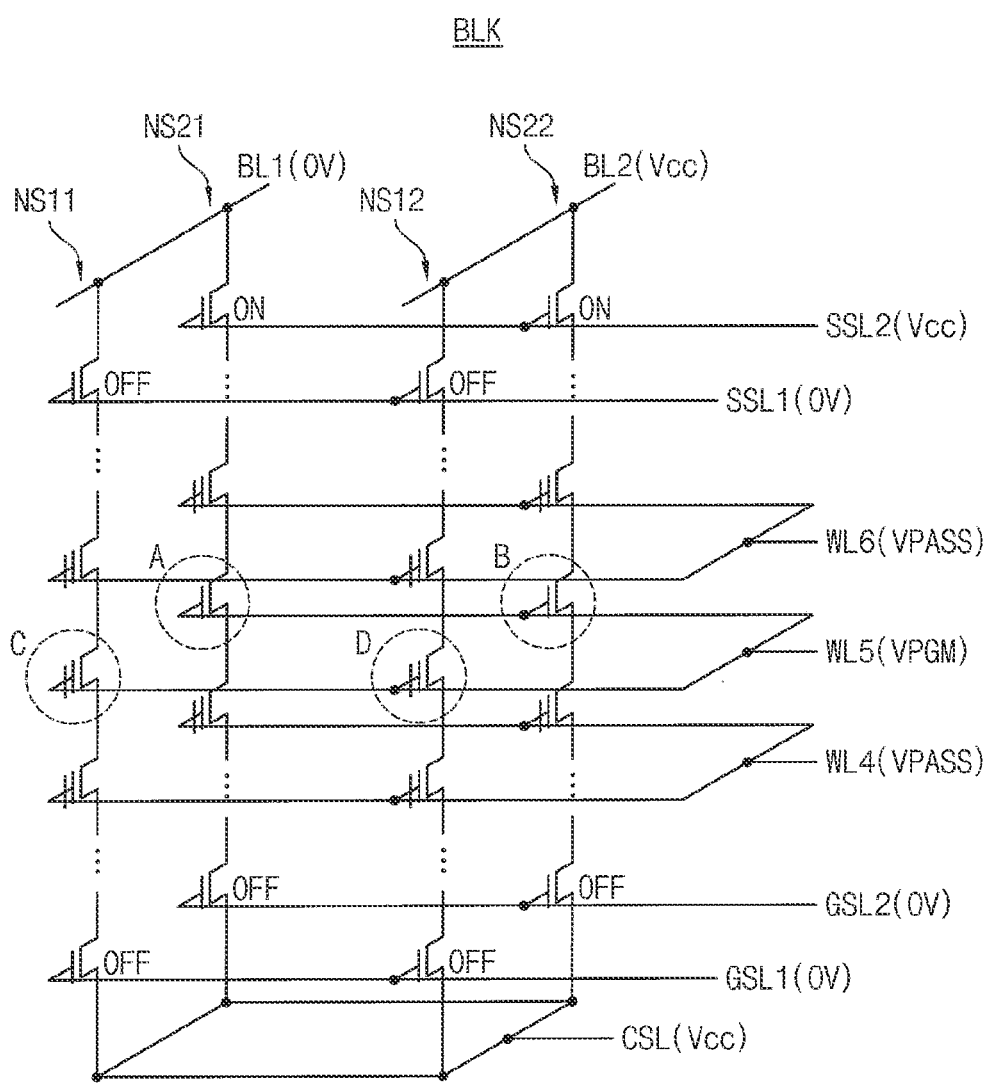
FIG. 9 is a circuit diagram illustrating a program bias condition of a three-dimensional flash memory device.

FIG. 9 is a circuit diagram illustrating a program bias condition of a three-dimensional flash memory device.

For convenience of description, among a plurality of NAND strings of a memory block BLK, NAND strings NS11 and NS21 connected to a first bitline BL1 and NAND strings NS12 and NS22 connected to a second bitline BL2 are illustrated in FIG. 9.

The first bitline BL1 may be a program bitline to which a program permission voltage (e.g., 0 V) is applied, and the second bitline BL2 may be a program inhibition bitline to which a program inhibition voltage such as a power supply voltage Vcc is applied. If the NAND string NS21 among the NAND strings NS11 and NS21 is selected, during a program operation, a voltage of 0 V may be applied to a first string selection line SSL1 (unselected string line), and the power supply voltage Vcc may be applied to a second string selection line SSL2 (selected string line).

The voltage of 0 V may be applied to ground selection lines GSL1 and GSL2. Furthermore, a voltage (e.g., Vcc) higher than 0 V may be applied to a common source line CSL. A program voltage VPGM (e.g., 18 V) may be applied to a selected wordline (e.g., WL5) and a pass voltage VPASS (e.g., 8 V) may be applied to unselected wordlines (e.g., WL4 and WL6).

Under the program bias condition, a voltage of 18 V may be applied to a gate of a memory cell A having a channel voltage of 0 V. Since a strong electric field is formed between the gate and a channel of the memory cell A, the memory cell A may be programmed. Since, however, since a channel voltage of a memory cell B is Vcc, and a low electric field is formed between a gate and the channel, the memory cell B may not be programmed. Further, since respective channels of memory cells C and D are in a floating state, channel voltages thereof may be boosted up to, for example, about 8 V, and thus, the memory cells C and D may not be programmed.

When the program voltage VPGM increases, the memory cell C of the unselected NAND string NS11 connected to the program permission bitline BL1 may be stressed excessively to be programmed unintentionally, which may be referred as program voltage disturbance. In addition, when the pass voltage VPASS increases, the memory cells except the memory cell A of the selected NAND string NS21 connected to the program permission bitline BL1 may be stressed excessively to be programmed unintentionally, which may be referred as pass voltage disturbance.

Figure 10:
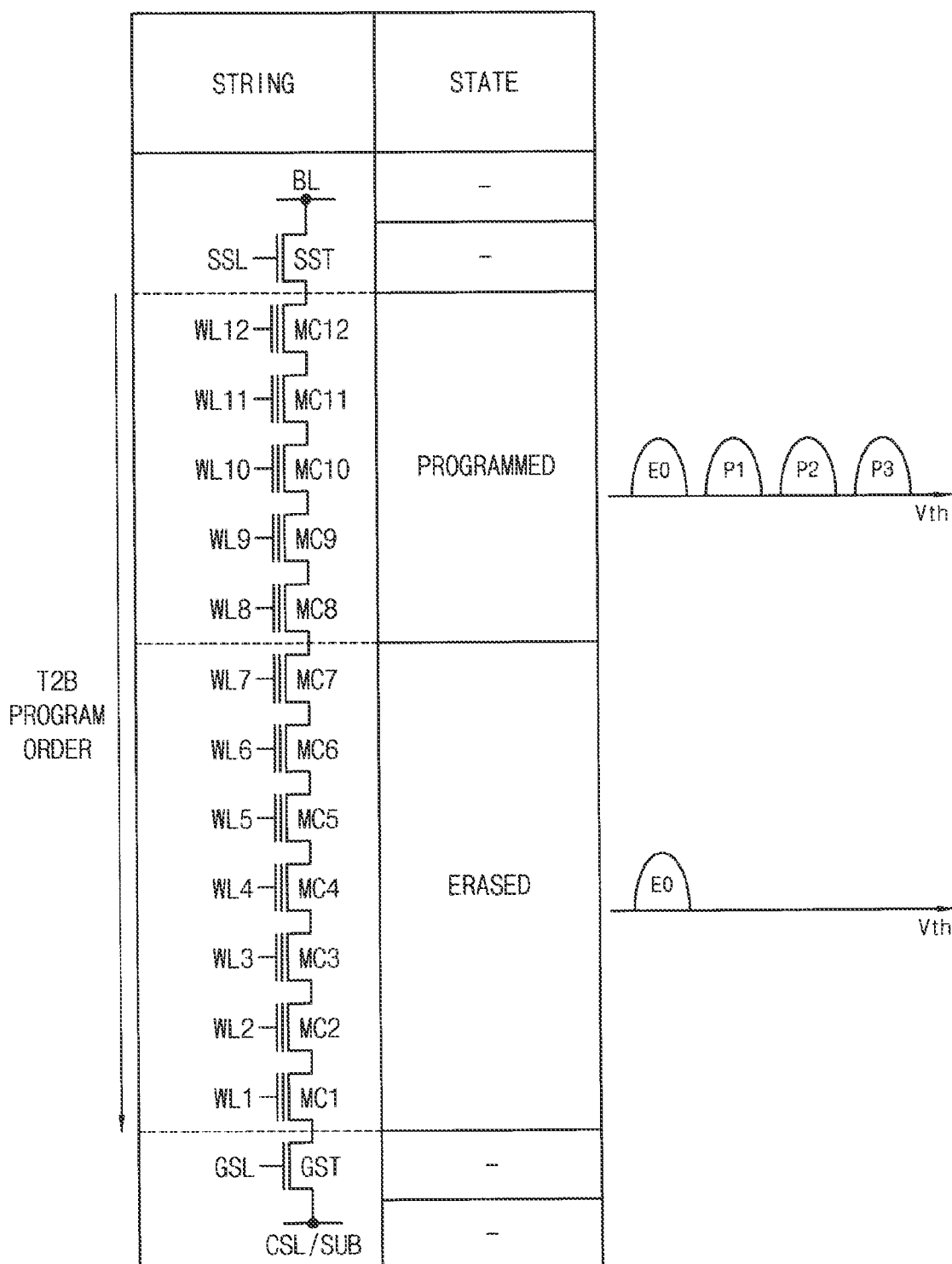
FIG. 10 is a diagram illustrating a first program scenario according to example embodiments.

FIG. 10 is a diagram illustrating a first program scenario according to embodiments.

FIG. 10 illustrates one cell string including a string selection transistor SST connected to a string selection line SSL, a ground selection transistor GST connected to a ground selection line GSL and memory cells MC1-MC12 connected to wordlines WL1-WL12, and states of memory cells. The cell string is connected between a bitline BL and a source line CSL. FIG. 10 illustrates a non-limiting example of twelve memory cells and an MLC storing two bits.

Referring to FIG. 10, according to a first program scenario, a program operation may be performed in a downward direction from an uppermost wordline. In other words, as data stored in the memory block increase, data may be filled in erased cells in the downward direction from top to bottom (T2B program order). Non-programmed memory cells MC1-MC7 are in an erased state E0, and each of programmed memory cells MC8-MC12 may be in one of the erased state E0 and programmed states P1, P2 and P3. For example, at least one of the memory cells MC2-MC11 may be an intermediate switching transistor.

Figure 11:
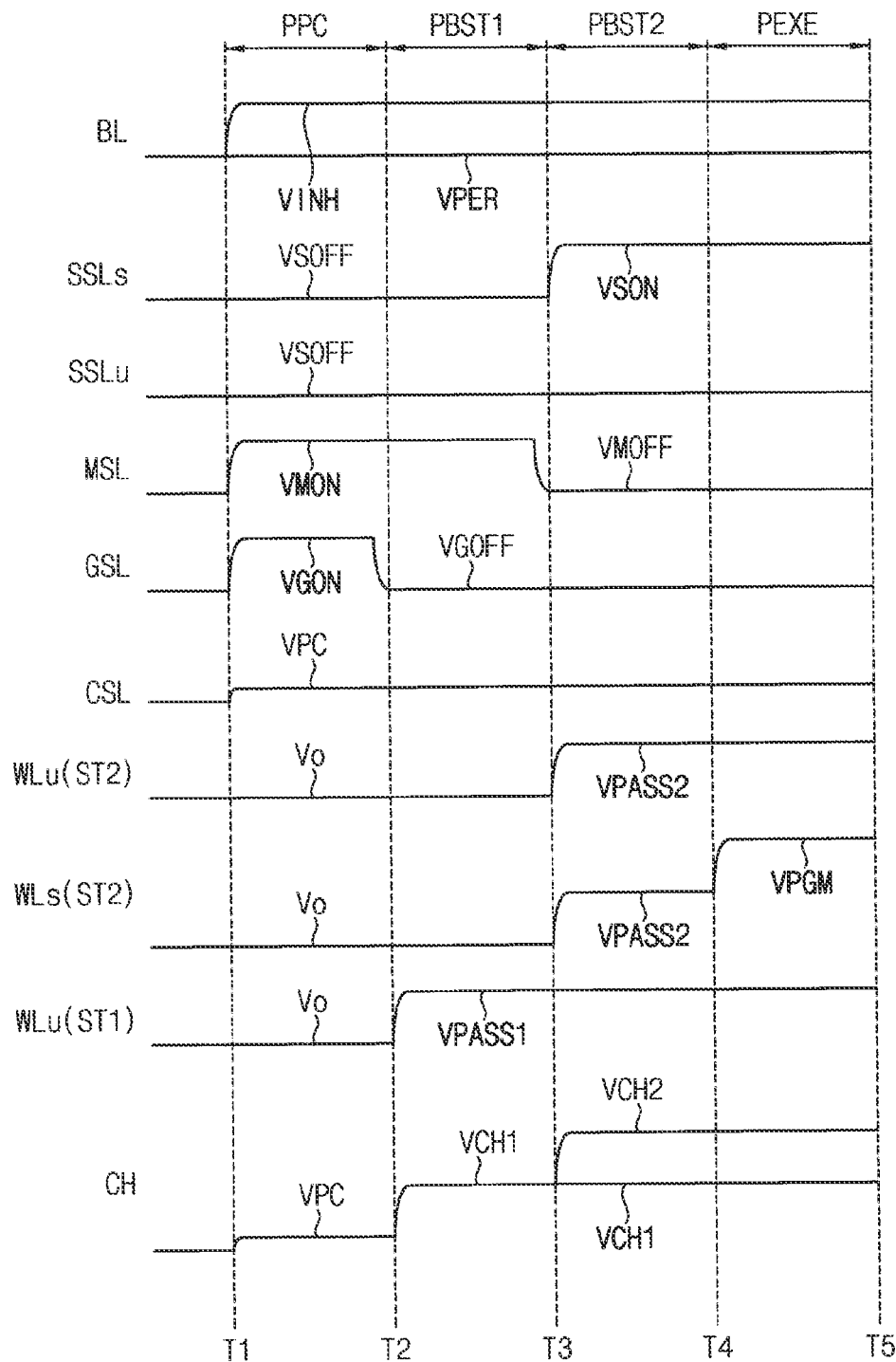
FIG. 11 is a timing diagram illustrating a program operation of a second stack according to the first program scenario of FIG. 10, according to example embodiments.

FIG. 11 is a timing diagram illustrating a program operation of a second stack of a cell string according to the first program scenario of FIG. 10.

FIG. 11 illustrates a boosting operation of intermediate switching transistors when a selected wordline WLs corresponding to a program address is included in the second stack ST2. In other words, a first stack ST1 corresponds to an erased stack indicating a stack in which all memory cells are in an erased state, and the second stack ST2 corresponds to a selected stack indicating a stack that includes memory cells to be programmed.

Time interval T1-T2 is a precharge period PPC, time interval T2-T3 is a first boosting period PBST1, time interval T3-T4 is a second boosting period PBST2 and time interval T4-T5 is a program execution period PEXE while a program voltage VPGM is applied to the selected wordline WLs. Hereinafter, a turn-on voltage and a turn-off voltage represent voltage of levels to turn on and off a corresponding transistor.

A program inhibition voltage VINH may be applied to the bitline BL when it is a program inhibition bitline, and a program permission voltage VPER may be applied to bitline BL when it is a program permission bitline.

During the precharge period PPC, a turn-off voltage VSOFF is applied to a selected string selection line SSLs and unselected string selection line SSLu, a turn-on voltage VMON is applied to an intermediate switching line MSL, and a turn-on voltage VGON is applied to a ground selection line GSL. Ground selection transistors and the intermediate switching transistors are turned on, and thus, a precharge voltage VPC of the source line CSL is applied to the channels CH of the first stack ST1 and the second stack ST2. As such, the precharge voltage VPC may be applied to the channels of the first stack ST1 and the second stack ST2 before performing the boosting operation of the first boosting period PBST1 and the second boosting period PBST2. During the precharge period PPC, an initialization voltage Vo may be applied to a selected wordline WLs and unselected wordlines WLu. The initialization voltage Vo may have a voltage level capable of turning on the erased memory cells. The programmed memory cells in the second stack ST2 are turned off, and the channel portion between the bitline BL and the programmed memory cell may be floated.

During the first boosting period PBST1, the intermediate switching line MSL maintains the turn-on voltage VMON, a turn-off voltage VGOFF is applied to the ground selection line GSL, and the channels of the first stack ST1 and the second stack ST2 are floated. A first pass voltage VPASS1 is applied to the wordlines WLu (ST1) of the first stack ST1 corresponding to the erased stack while the intermediate switching transistors are turned on. As a result, the channels CH of the first stack ST1 and the second stack ST1 may be boosted to a first channel voltage VCH1. The first channel voltage VCH1 may be represented approximately as Equation 1 below.

$$VCH1=VPC+VBST1=VPC+VPASS1*N1/[(N2-Np)+N1] \quad (1)$$

In Equation 1, VPC is the precharge voltage, VBST1 is a first booted voltage, N1 is the number of the wordlines of the first stack ST1, N2 is the number of the wordlines of the second stack ST2, Np is the number of the wordlines corresponding to (or connected to) previously-programmed memory cells, in the second stack ST2. As represented by Equation 1, the first boosted voltage VBST1 increases and the number Np increases.

During the second boosting period PBST2, a turn-on voltage VSON is applied to the selected string selection line SSLs, a turn-off voltage VMOFF is applied to the intermediate switching line MSL, and thus, the first stack ST1 and the second stack ST2 are electrically disconnected from each other. A second pass voltage VPASS2 is applied to the wordlines WLu (ST2) and WLs (ST2) of the second stack ST2 corresponding to the selected stack while the intermediate switching transistors are turned off. As a result, the channels CH of the first stack ST1 may maintain the first channel voltage VCH1, and the channels of the second stack ST2 may be further boosted to a second channel voltage VCH2. Even though not illustrated, the channels of the second stack ST2 in the selected cell string may have the program permission voltage VPER or the program inhibition voltage VINH according to the bitline voltage because the turn-on voltage VSON is applied to the selected string selection line SSLs. The second channel voltage VCH2 may be represented approximately as Equation 2.

$$VCH2=VCH1+VBST2=VPC+VBST1+VBST2=VPC+VPASS1*N1/[(N2-Np)+N1]+VPASS2 \quad (2)$$

In Equation 2, VBST2 is a second booted voltage, and the second boosted voltage VBST2 corresponds to the second pass voltage VPASS2.

After the precharge period PPC, a turn-off voltage VGOFF is applied to the ground selection line GSL to electrically disconnect the cell strings from the source line CSL.

During program execution period PEXE, a program voltage VPGM is applied to the selected wordline WLs (ST2) of the second stack ST2 corresponding to the selected stack, and the selected memory cells connected to the bitlines BL to which the program permission voltage VPER is applied may be programmed.

As such, the boosting operation according to embodiments may include the first boosting operation of the first boosting period PBST1 and the second boosting operation of the second boosting period PBST2, which may be referred to as double boosting.

The first boosting operation may be performed such that the first pass voltage VPASS1 is applied to the wordlines of the erased stack ST1 among the plurality of stacks ST1 and ST2 while the plurality of intermediate switching transistors are turned on by applying the turn-on voltage VMON to the intermediate switching line MSL during the first boosting period PBST1. The second boosting operation may be performed such that, after the first pass voltage VPASS1 is applied to the wordlines of the erased stack ST1, the second pass voltage VPASS2 is applied to the wordlines of the selected stack ST2 among the plurality of stacks ST1 and ST2 while the plurality of intermediate switching transistors are turned off by applying the turn-off voltage VMOFF to the intermediate switching line MSL during the second boosting period PB ST2.

The channels of the erased stack ST1 and the channels of the selected stack ST2 are electrically connected to each other by turning-on of the plurality of intermediate switching transistors while the first pass voltage VPASS1 is applied to the wordlines of the erased stack ST1 during the first boosting period PBST1. In contrast, the channels of the erased stack ST1 and the channels of the selected stack ST2 are electrically disconnected from each other by turning-off of the plurality of intermediate switching transistors while the second pass voltage VPASS2 is applied to the wordlines of the selected stack ST2 during the second boosting period PBST2.

Accordingly, as represented by Equation 1 and Equation 2, the channels of the erased stack ST1 and the channels of the selected stack ST2 are boosted to the first channel voltage VCH1 by the first boosting operation, and only the channels of the selected stack ST2 are further boosted to the second channel voltage VCH2 by the second boosting operation. At time point T4 when the second boosting operation is completed, the second channel voltage VCH2 of the selected stack ST2 becomes higher than the first channel voltage VCH1 of the erased stack ST1.

Figure 12A:
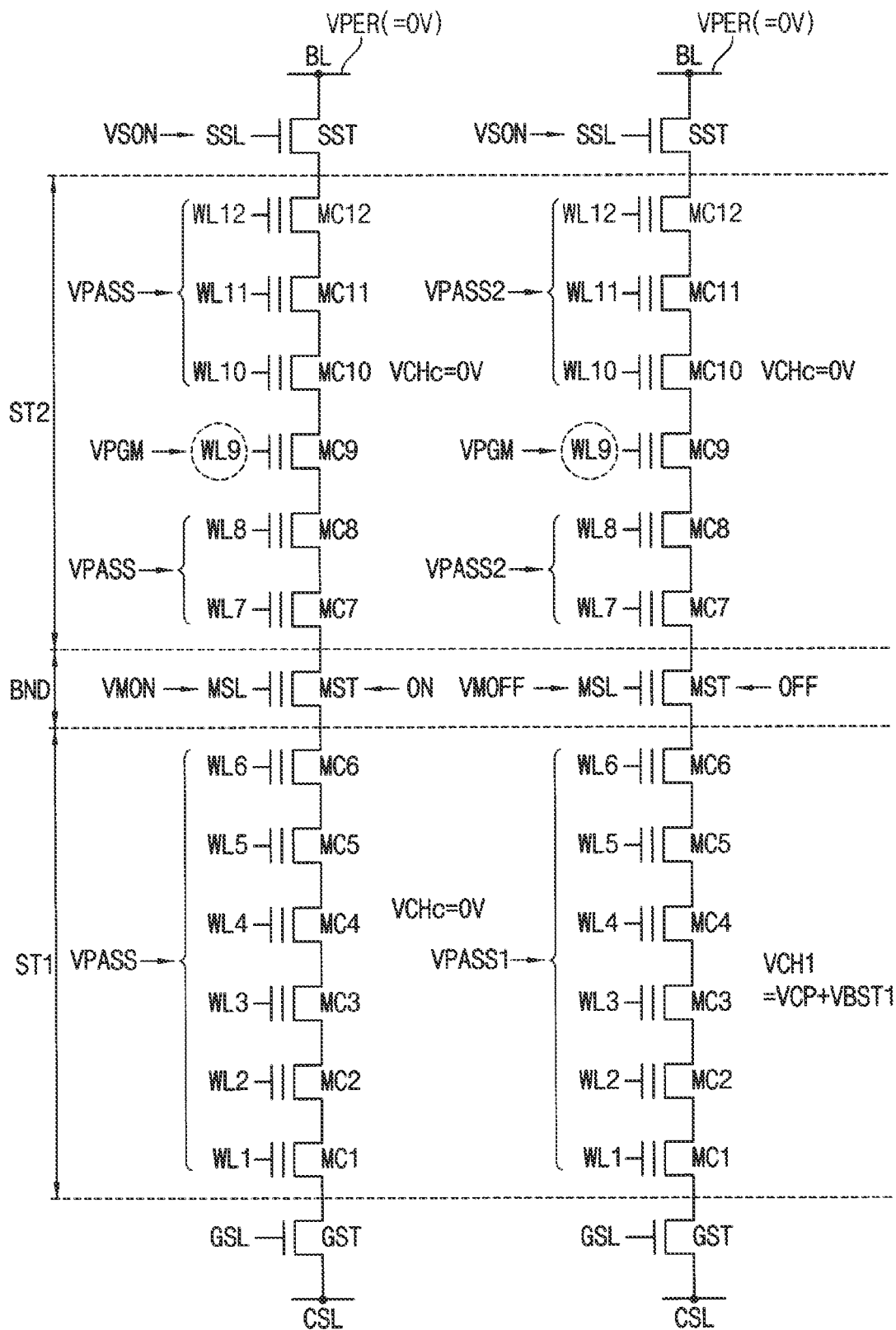
FIG. 12A is a diagram for describing decrease in pass voltage disturbance in a nonvolatile memory device, according to example embodiments.
Figure 12B:
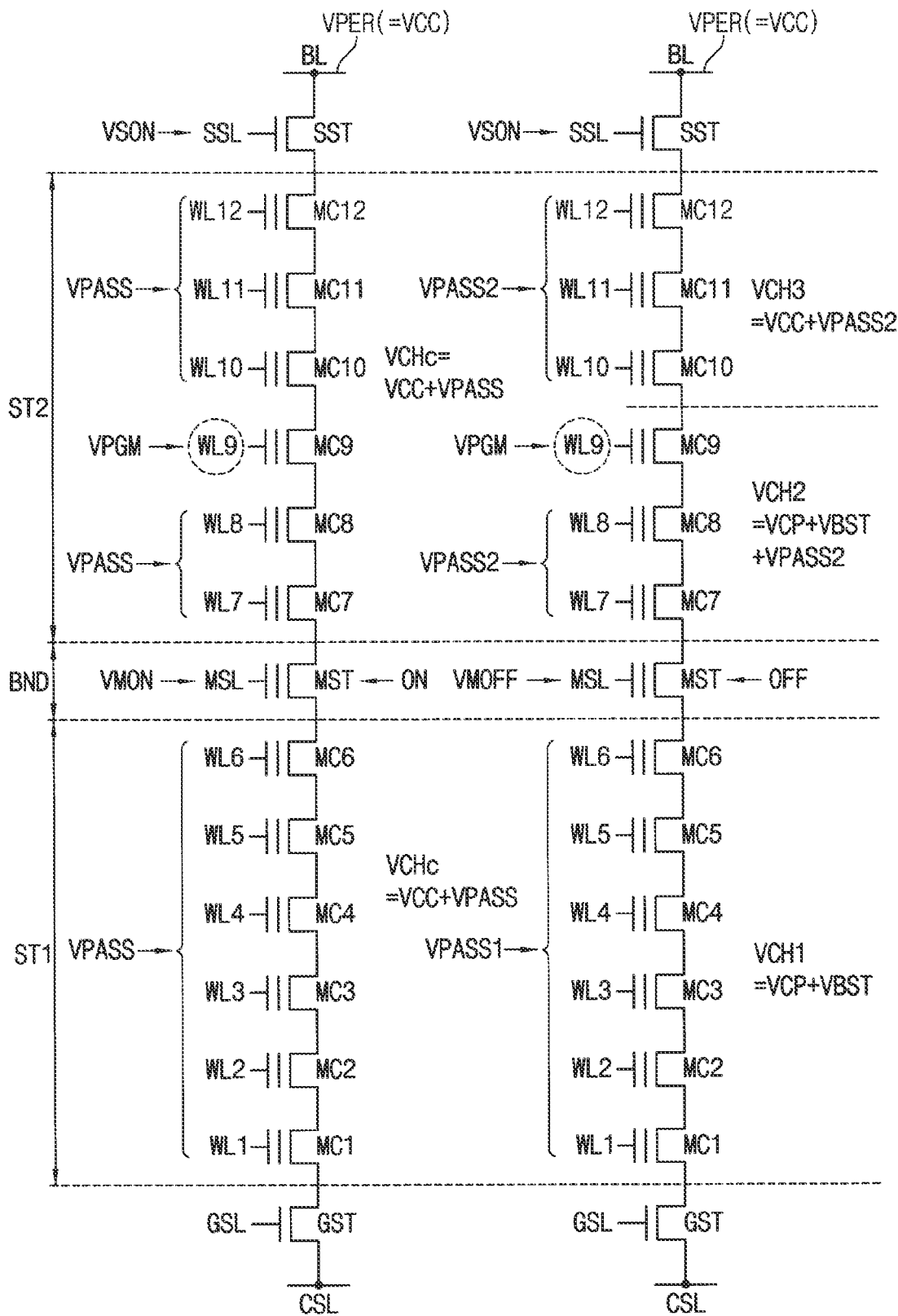
FIG. 12B is a diagram for describing decrease in program voltage disturbance of a nonvolatile memory device, according to example embodiments.

FIG. 12A is a diagram for describing decrease in pass voltage disturbance in a nonvolatile memory device according to embodiments, and FIG. 12B is a diagram for describing decrease in program voltage disturbance of a nonvolatile memory device according to embodiments.

FIGS. 12A and 12B illustrate a structure of a cell string connected between a bitline BL and a source line CSL where the cell string includes a string selection transistor SST connected to a string selection line SSL, a plurality of memory cells MC1-MC12 connected to wordlines WL1-WL12, respectively, an intermediate switching transistor MST connected to an intermediate switching line MSL and a ground selection transistor GST connected to a ground selection line GSL, which are disposed vertically. The left portions of FIGS. 12A and 12B illustrate cases according to a conventional scheme and the right portion of FIGS. 12A and 12B illustrated cases according to embodiments. The cell string of FIGS. 12A and 12B is a selected cell string such that a turn-on voltage VSON is applied to the string selection line SSL. A first stack ST1 corresponds to an erased stack in which all memory cells are in an erased state, and a second stack ST2 corresponds to a selected stack that includes memory cells to be programmed presently.

FIG. 12A illustrates channel voltages of the cell string when a program permission voltage VPER is applied to the bitline BL. In case of the conventional method, the turn-on voltage VMON is applied to the intermediate switching line MSL corresponding to a dummy wordline, the intermediate switching transistor MST is turned on, and thus, the channel voltage VCHe of the erased stack ST1 becomes equal to the channel voltage VCHc of the selected stack ST2. In this case, the voltage difference between the channels and the gate electrodes of the memory cells MC1-MC6 of the erased stack ST1 is the pass voltage VPASS. In contrast, in case of double boosting according to embodiments, the turn-off voltage VMOFF is applied to the intermediate switching line MSL, the intermediate switching transistor MST is turned off, and thus, the channels of the erased stack ST1 are boosted to the first channel voltage VCH1. In this case, the voltage difference between the channels and the gate electrodes of the memory cells MC1-MC6 of the erased stack ST1 is VPASS1-VCH1. As a result, the pass voltage disturbance of the erased stack ST1 may be reduced or prevented by the double boosting according to embodiments.

FIG. 12B illustrates channel voltages of the cell string when a program inhibition voltage VINH is applied to the bitline BL. In case of the conventional method, the turn-on voltage VMON is applied to the intermediate switching line MSL corresponding to a dummy wordline, the intermediate switching transistor MST is turned on, and thus, the channel voltage VCHe of the erased stack ST1 becomes equal to the channel voltage VCHc of the selected stack ST2. In this case, the voltage difference between the channel and the gate electrode of the memory cell MC9 to which the program voltage VPGM is VPGM-VCC-VPASS. In contrast, in case of double boosting according to embodiments, the turn-off voltage VMOFF is applied to the intermediate switching line MSL, and the intermediate switching transistor MST is turned off. Thus the channels of the erased stack ST1 are boosted to the first channel voltage VCH1, the channels of the erased memory cells MC7-MC9 of the selected stack ST2 are boosted to the second channel voltage VCH2, and the channels of the programmed memory cells MC10-MC12 of the selected stack ST2 are boosted to the third channel voltage VCH3. In this case, the voltage difference between the channel and the gate electrode of the memory cell MC9 to which the program voltage VPGM is VPGM-VCC-VBST-VPASS2. As a result, the program voltage disturbance of the memory cell MC9 to which the program voltage VPGM may be reduced or prevented by the double boosting according to embodiments.

FIGS. 13A and 13B are diagrams for describing decreases in pass voltage disturbance and program voltage disturbance in incremental step pulse programming (ISPP) of a nonvolatile memory device according to embodiments.

FIG. 13A illustrates the ISPP by a conventional method, and FIG. 13B illustrates the ISPP by double boosting according to embodiments. Referring to FIGS. 13A and 13B, a plurality of program loops LOOP1-LOOP7 may be sequentially performed until programming is completed according to the ISPP. As the program loops are repeated, the voltage level of the program voltage VPGM may be increased (e.g., from 15V to 21V), and also the second pass voltage VPASS2 may be increased.

In FIGS. 13A and 13B, the cases where the program voltage disturbance or the pass voltage disturbance occurs are represented by YES, and the cases where the program voltage disturbance or the pass voltage disturbance does not occur are represented by NO. In the case of FIG. 13A, the program voltage disturbance occurs when VPGM-VPASS2 is equal to or greater than 9V, and the pass voltage disturbance occurs when VPASS is equal to or higher than 7V. In the case of FIG. 13B, the program voltage disturbance occurs when VPGM-VPASS2-VBST is equal to or greater than 9V, and the pass voltage disturbance occurs when VPASS is equal to or higher than 7V. Here, VBST is the above-described boosted voltage and the boosted voltage is assumed to be 2V.

As illustrated in FIGS. 13A and 13B, the pass voltage VPASS2 may be lowered for the program loops where the program voltage disturbance does not occur using the double boosting according to embodiments, and thus, the number of the program loops where the pass voltage disturbance occurs may be reduced. In addition, the number of the program loops where the program voltage disturbance occurs may be reduced by the boosted voltage VBST.

Figure 14:
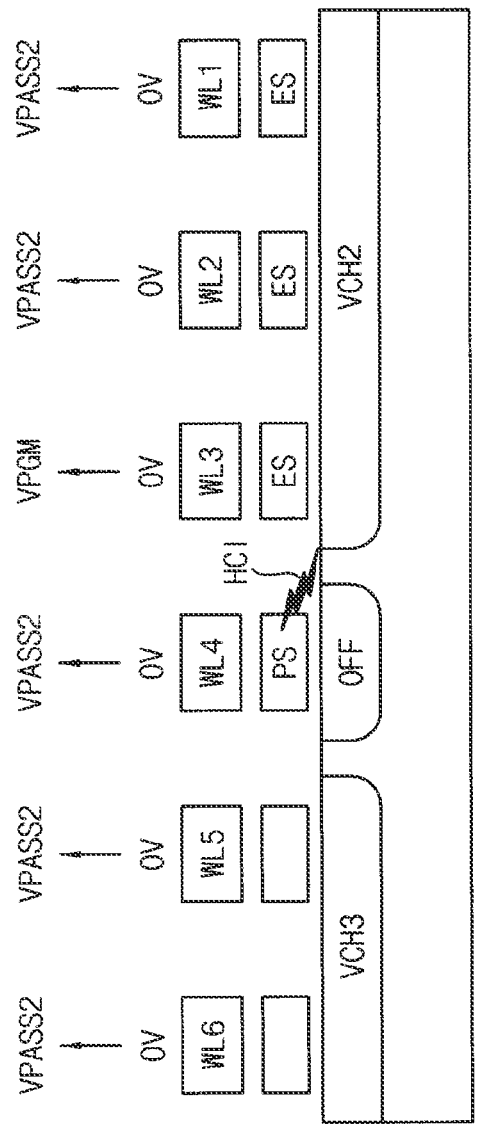
FIG. 14 is a diagram illustrating a hot carrier injection that may be caused by a programming method in a nonvolatile memory device.

FIG. 14 is a diagram illustrating a hot carrier injection that may be caused by a programming method in a nonvolatile memory device.

FIG. 14 illustrates a hot carrier injection HCI that may occur in the above-described selected stack. As described above with reference to FIGS. 11, 12A and 12B, with respect to the selected stack, the initialization voltage (e.g., 0V) may be applied to the wordlines WL7-WL12 during the first boosting period PBST1, and the second pass voltage VPASS2 may be applied to the wordlines WL7-WL12 during the second boosting period PBST2. Because the memory cell in the programmed state PS is turned off, the channels corresponding to the wordlines WL10-WL12 to which the program operation was performed already may have the third channel voltage VCH3, and the channels corresponding to the wordlines WL7-WL9 to which the program operation is not performed yet may have the second channel voltage VCH2. As described with reference to Equation 1 and Equation 2, the second channel voltage VCH2 increases as the number Np of the wordlines corresponding to previously-programmed memory cells in the selected stack increases. In addition, as the number Np increases, the boosting effect by the program voltage VPGM may be increased, and the second channel voltage VCH2 may be increased excessively. If the difference between the second channel voltage VCH2 and the third channel voltage VCH3 exceeds a threshold value, the programmed state PS of the memory cell in the boundary region may be distorted by the hot carrier injection HCI. Accordingly the double boosting according to embodiments may be controlled as will be described with reference to FIGS. 15 and 16.

Figure 15:
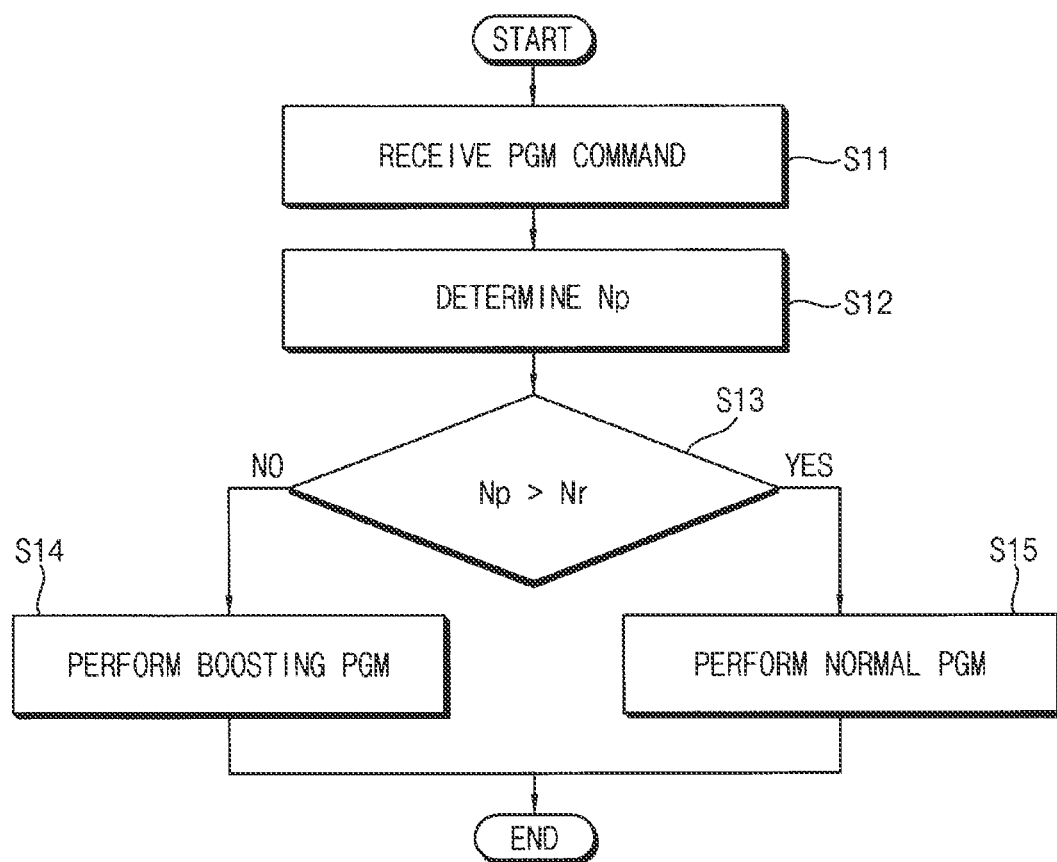
FIGS. 15 and 16 are flow charts illustrating a method of programming in a nonvolatile memory device, according to example embodiments.
Figure 16:
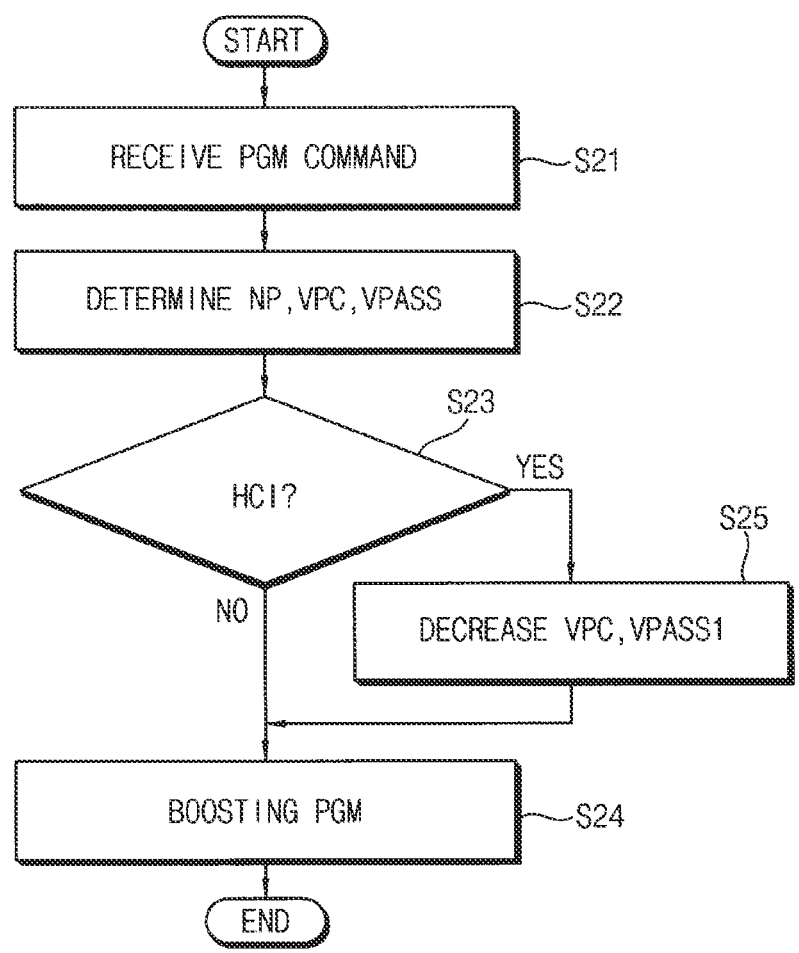

FIGS. 15 and 16 are flow charts illustrating a method of programming in a nonvolatile memory device according to embodiments.

Referring to FIGS. 2, 3 and 15, the nonvolatile memory device 30 may receive a programming (PGM) command (S11) and prepare a program operation. The control circuit 450 of the nonvolatile memory device 30 may determine a program line number Np corresponding to a number of wordlines corresponding to previously-programmed memory cells in a selected stack (S12). The control circuit 450 may control a boosting operation based on the program line number Np. For example, the control circuit 450 may compare the program line number Np with a predetermined reference number Nr (S13). When the program line number Np is smaller than the reference number Nr (S13: NO), the control circuit 450 may perform a boosting PGM with the above-described boosting operation (S14). When the program line number Np is greater than the reference number Nr (S13: YES), the control circuit 450 may perform a normal PGM by omitting the boosting operation (S15).

As such, the hot carrier injection HCI as described with reference to FIG. 14 may be prevented by controlling the boosting operation based on the program line number Np.

Referring to FIGS. 2, 3 and 16, the nonvolatile memory device 30 may receive a programming (PGM) command (S21) and prepare a program operation. The control circuit 450 of the nonvolatile memory device 30 may determine a program line number Np corresponding to a number of wordlines corresponding to previously-programmed memory cells in a selected stack, a precharge voltage VPC and a first pass voltage VPASS1 (S22). The control circuit 450 may control a boosting operation based on the program line number Np, the precharge voltage VPC and the first pass voltage VPASS1. For example, the control circuit 450 may determine whether the hot carrier injection HCI occurs based on the program line number Np, the precharge voltage VPC and the pass voltage VPASS (S23). When it is determined that the hot carrier injection HCI does not occur (S23: NO), the control circuit 450 may perform a boosting PGM with the above-described boosting operation (S24). When it is determined that the hot carrier injection HCI occurs (S23: YES), the control circuit 450 may decrease at least one of the precharge voltage VPC and the first pass voltage VPASS1 (S25), and then, the control circuit 450 may perform the boosting PGM with the above-described boosting operation (S24). As described with reference to Equation 1, the first boosted voltage VBST1 may be decreased by decreasing at least one of the precharge voltage VPC and the first pass voltage VPASS1.

As such, the hot carrier injection HCI as described with reference to FIG. 14 may be prevented by decreasing at least one of the precharge voltage VPC and the first pass voltage VPASS1 as the program line number Nr increases.

Figure 17:
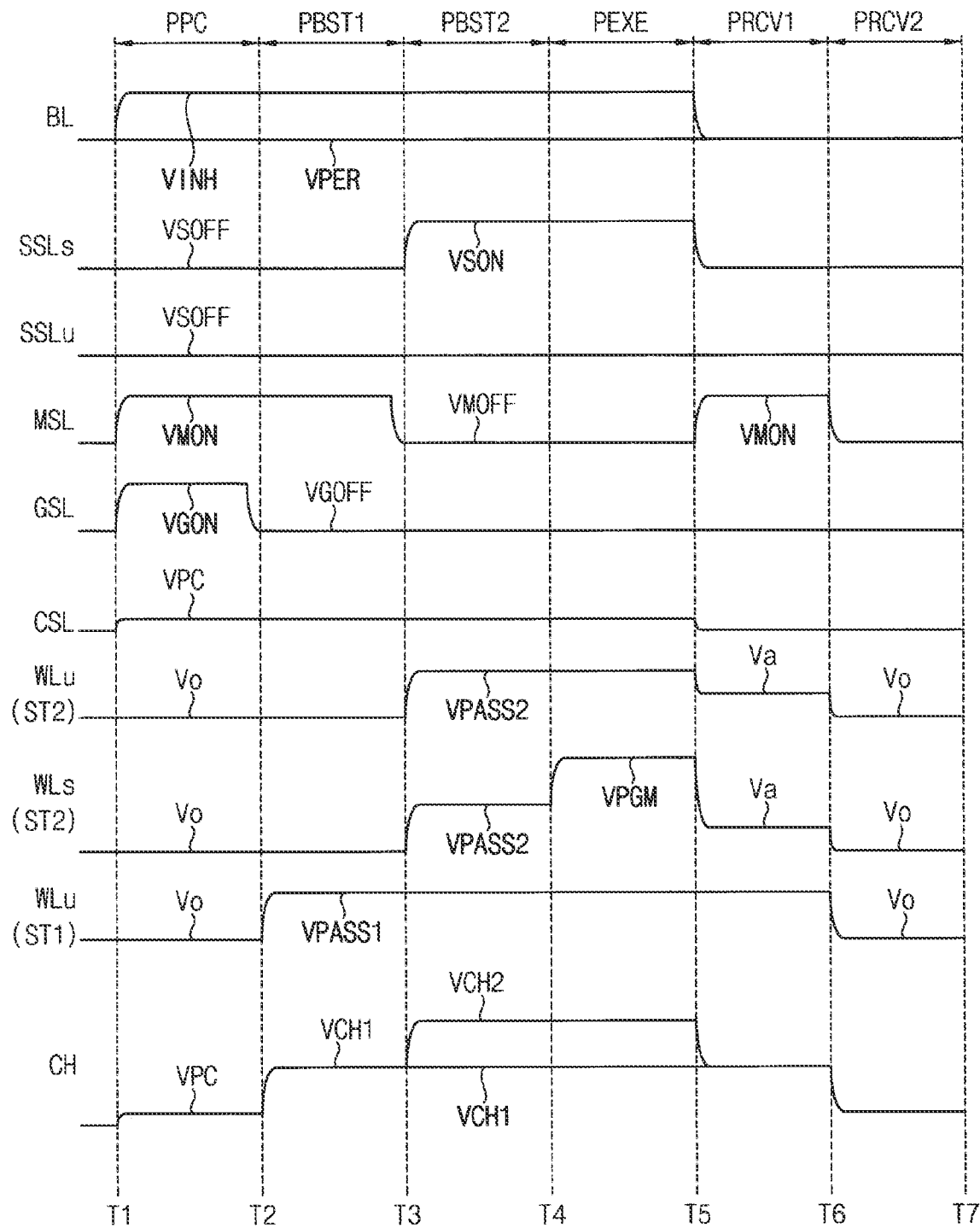
FIG. 17 is a timing diagram illustrating a program operation of a second stack according to the first program scenario of FIG. 10, according to example embodiments.

FIG. 17 is a timing diagram illustrating a program operation of a second stack of a cell string according to the first program scenario of FIG. 10. The precharge period PPC, the first boosting period PBST1, the second boosting period PBST2 and the program execution period PEXE are the same as FIG. 11, and the repeated descriptions are omitted.

As described with reference to FIGS. 11, 12A and 12B, the channels of the erased stack ST1 have the first channel voltage VCH1, and the channels of the selected stack ST2 have the second channel voltage VCH2 that is further boosted. If the channels of the first and second stacks ST1 and ST2 are connected electrically to each other, the hot carrier injection HCI may be caused by the voltage difference between the first and second channel voltages VCH1 and VCH2.

Referring to FIG. 17, a recovery operation for initializing voltages of wordlines may be performed sequentially during a first recovery period PRCV1 of time interval T5-T6 and a second recovery period PRCV2 of time interval T6-T7.

During the first recovery period PRCV1, the voltages of the wordlines of the selected stack ST2 may be decreased from the second pass voltage VPASS2 to an intermediate voltage Va lower than the second pass voltage VPASS2 and higher than the initialization voltage Vo. The plurality of intermediate switching transistors may be turned on after the voltage of the wordlines of the selected stack ST2 are decreased to the intermediate voltage Va.

During the second recovery period PRCV2, the voltages of the wordlines of the erased stack ST1 may be decreased from the first pass voltage VPASS1 to the initialization voltage Vo, and, simultaneously, the voltages of the wordlines of the selected stack ST2 may be decreased from the intermediate voltage Va to the initialization voltage Vo.

As a result, the channel voltages of the selected stack ST2 may be decreased firstly during the first recovery period PRCV1, the intermediate switching transistors are turned on to electrically connect the channels of the selected stack ST2 and the erased stack ST1, and then the channel voltages of the selected stack ST2 and the erased stack ST1 may be decreased secondly during the second recovery period PRCV2.

As such, the hot carrier injection HCI may be prevented by performing the recovery operation to initialize the wordline voltages of the plurality of stacks ST1 and ST2 by controlling the switching operation of the plurality of intermediate switching transistors.

Figure 18:
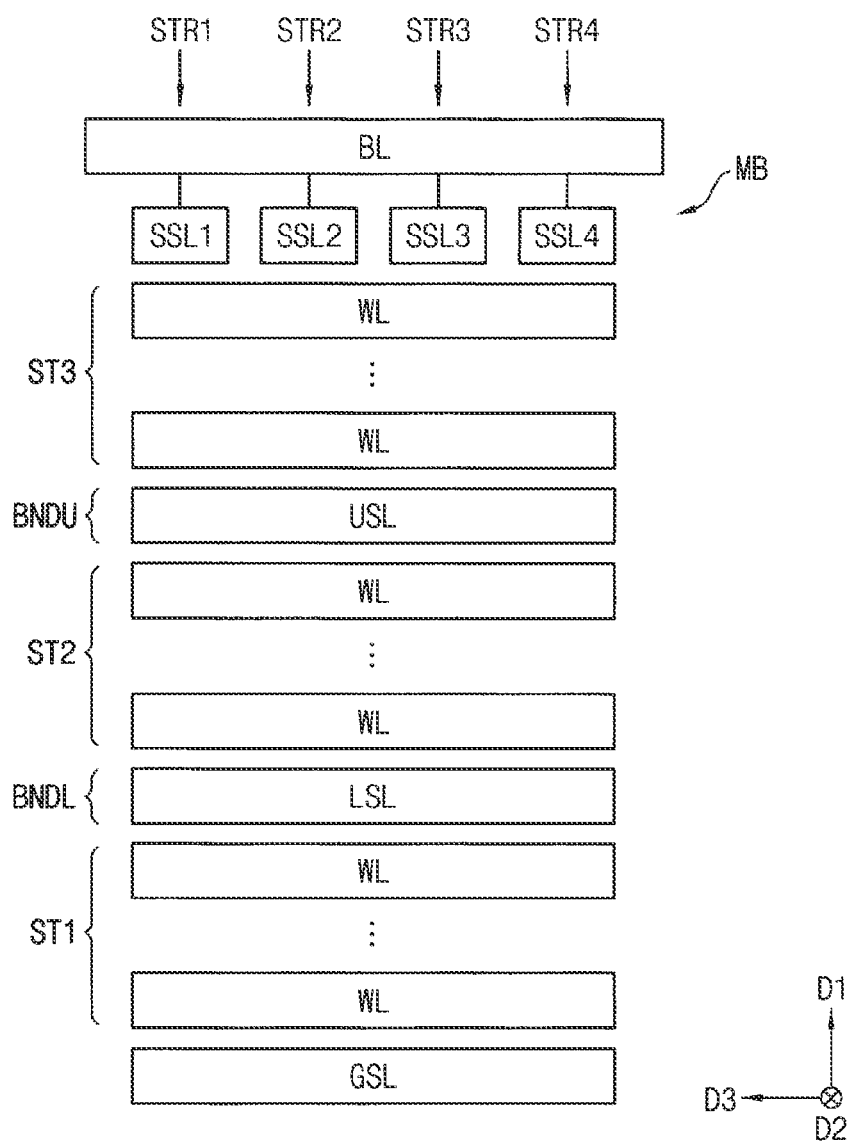
FIG. 18 is a cross-sectional view illustrating a memory block divided into three stacks, according to example embodiments.

FIG. 18 is a cross-sectional view illustrating a memory block divided into three stacks according to embodiments.

Referring to FIG. 18, the above-described boundary portion BND may include a lower boundary portion BNDL and an upper boundary portion BNDU. A memory block MB may include a first stack ST1 below the lower boundary portion BNDL, a second stack ST2 between the lower boundary portion BNDL and the upper boundary portion BNDU, and a third stack ST3 above the upper boundary portion BNDU.

The above-described intermediate switching transistors may include a plurality of lower switching transistors disposed in the lower boundary portion BNDL and connected to a lower switching line LSL, and a plurality of upper switching transistors disposed in the upper boundary portion BNDU and connected to an upper switching line USL.

FIGS. 19A and 19B are diagrams illustrating a program operation with respect to stacks of the memory cell array of FIG. 18 according to the first program scenario of FIG. 10. The repeated descriptions with FIG. 11 may be omitted.

FIGS. 19A and 19B illustrate voltages during the above-described precharge period PPC, the first boosting period PBST1 and the second boosting period PBST2.

FIG. 19A corresponds to a case where the program operation is performed to the third stack ST3 according to the above-described first program scenario T2B. In this case, the first stack ST1 and the second stack ST2 correspond to the above-describe erased stacks and the third stack ST3 corresponds to the above-described selected stack.

During the precharge period PPC and the first boosting period PBST1, turn-on voltages VLON and VUON are applied to the lower switching line LSL and the upper switching line USL, respectively. During the second boosting period PBST2, turn-off voltages VLOFF and VUOFF are applied to the lower switching line LSL and the upper switching line USL, respectively. The other voltages are the same as described with reference to FIG. 11. Through such control of the switching operation of the intermediate switching transistors MC4 and MC8, the double boosting as described above may be implemented with respect to the third stack ST3 corresponding to the selected stack.

FIG. 19B corresponds to a case where the program operation is performed to the second stack ST2 according to the above-described first program scenario T2B. In this case, the first stack ST1 corresponds to the above-describe erased stacks and the second stack ST2 corresponds to the above-described selected stack.

During the precharge period PPC and the first boosting period PBST1, turn-on voltages VLON and VUON are applied to the lower switching line LSL and the upper switching line USL, respectively. During the second boosting period PBST2, turn-off voltages VLOFF and VUOFF are applied to the lower switching line LSL and the upper switching line USL, respectively. The other voltages are the same as described with reference to FIG. 11. Through such control of the switching operation of the intermediate switching transistors MC4 and MC8, the double boosting as described above may be implemented with respect to the second stack ST2 corresponding to the selected stack.

Figure 20:
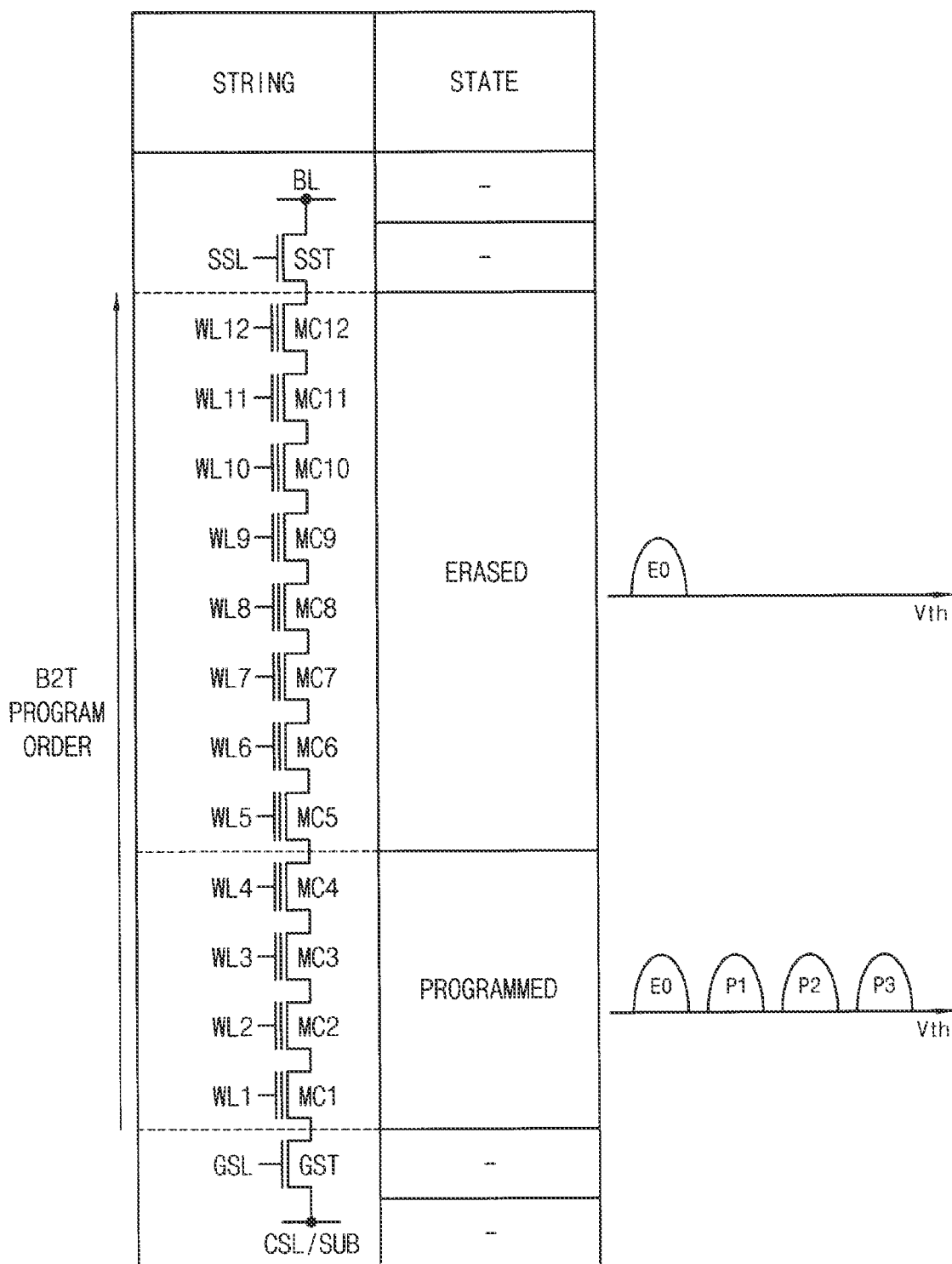
FIG. 20 is a diagram illustrating a second program scenario according to example embodiments.

FIG. 20 is a diagram illustrating a second program scenario according to embodiments. The repeated descriptions with FIG. 10 may be omitted.

Referring to FIG. 20, according to a second program scenario, a program operation may be performed in an upward direction from a lowest wordline. In other words, as data stored in a memory block increase, data may be filled in erased cells in the upward direction from bottom to top (B2T program order). Non-programmed memory cells MC5-MC12 are in an erased state E0, and each of programmed memory cells MC1-MC4 may be in one of the erased state E0 and programmed states P1, P2 and P3. For example, at least one of the memory cells MC2-MC11 may be an intermediate switching transistor.

Figure 21:
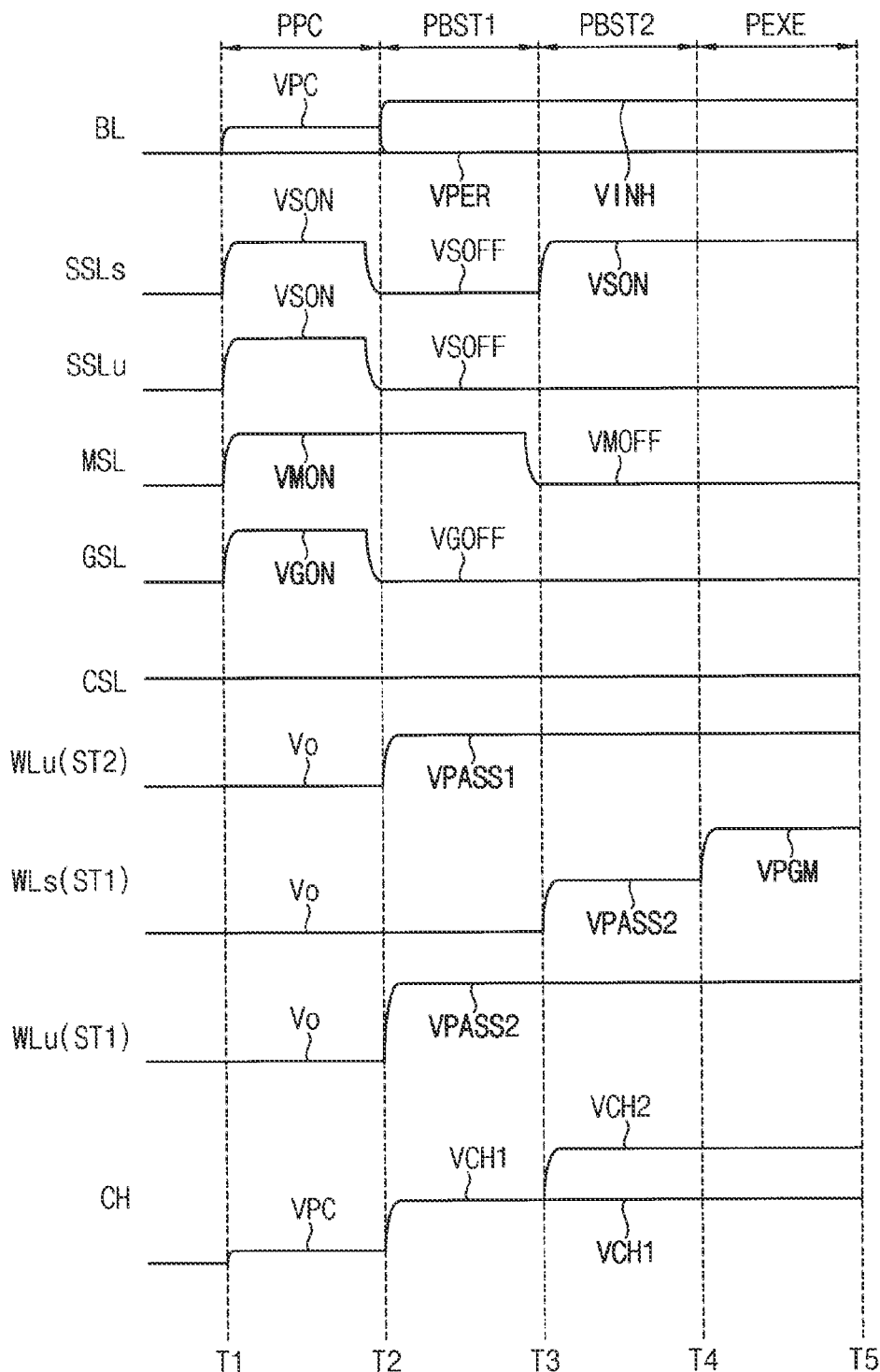
FIG. 21 is a timing diagram illustrating a program operation of a first stack according to the second program scenario of FIG. 20, according to example embodiments.

FIG. 21 is a timing diagram illustrating a program operation of a first stack according to the second program scenario of FIG. 20. The repeated descriptions with FIG. 11 may be omitted.

In the case of FIG. 11, the first stack ST1 corresponds to an erased stack and the second stack ST2 corresponds to the selected stack. In contrast, in a case of FIG. 21, the first stack ST1 corresponds to the selected stack and the second stack ST2 corresponds to the erased stack.

Accordingly, the above-described first boosting operation may be performed by applying the first pass voltage VPASS1 to the wordlines of the second stack ST2, and after the first boosting operation, the above-described second boosting operation may be performed by applying the second pass voltage VPASS2 to the wordlines of the first stack ST1.

In the second program scenario, when the program operation is performed to the first stack ST1 corresponding to the selected stack, a previously-programmed memory cell may exist between a selected memory cell to be programmed presently and the source line CSL. Therefore, during the precharge period PPC, the precharge voltage VPC may be applied to the channels of the first stack ST1 and the second stack ST2 by applying the precharge voltage VPC to the bitline BL, applying the turn-on voltage VSON to the string selection lines SSLs and SSLu and the turn-on voltage VMON to the intermediate switching line MSL.

Figure 22A:
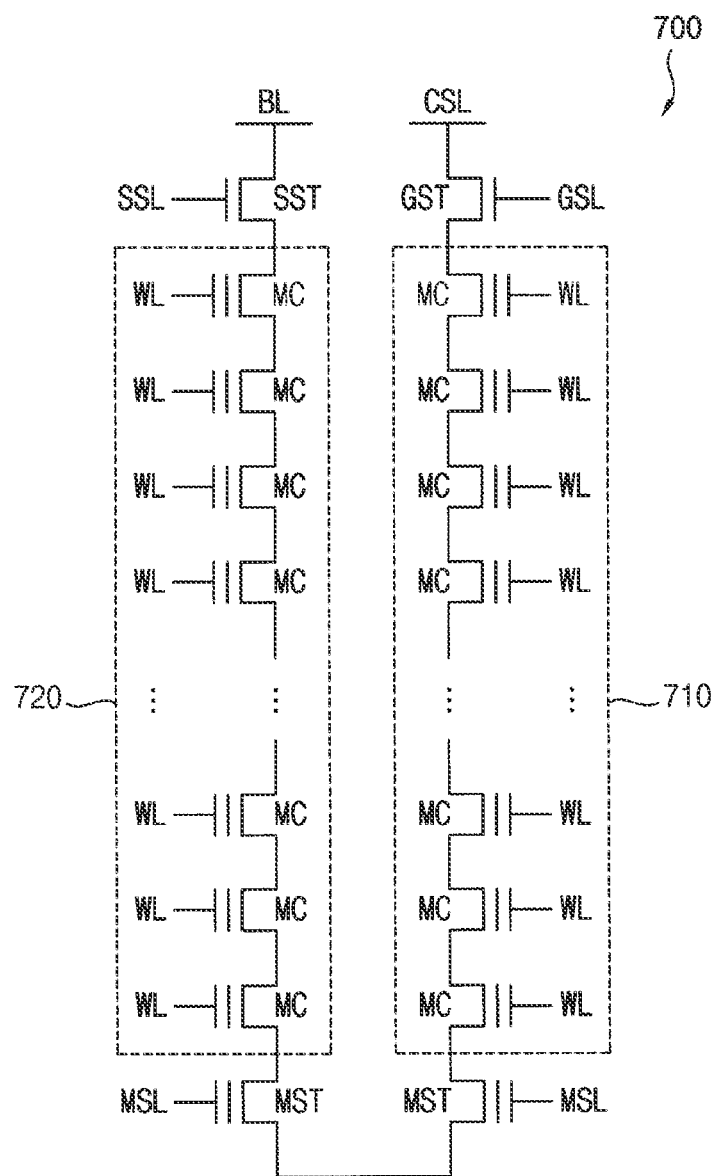
FIGS. 22A and 22B are diagrams illustrating example embodiments of a memory cell array included in a nonvolatile memory device.
Figure 22B:
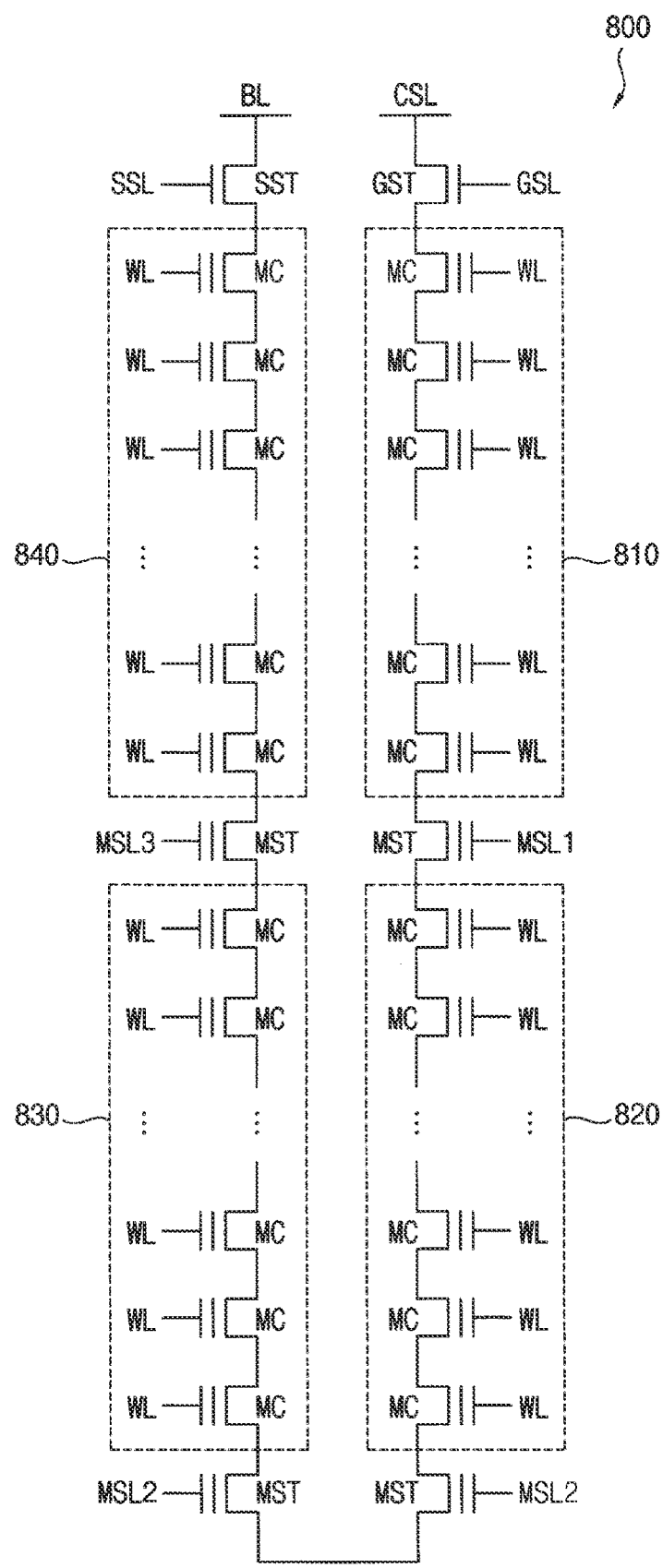

FIGS. 22A and 22B are diagrams illustrating embodiments of a memory cell array included in a nonvolatile memory device according to embodiments.

FIGS. 22A and 22B illustrate structures that both of the bitline BL and the source line CSL are disposed above the memory cell arrays 700 and 800. One cell string is illustrated for convenience of illustration, and each of the memory cell arrays 700 and 800 may include a plurality of cell strings of the same configuration. Each cell string may include a string selection transistor SST controlled by a string selection line SSL, memory cells MC controlled by wordlines WL, an intermediate switching transistor controlled by an intermediate switching line MSL and a ground selection transistor GST controlled by a ground selection line GSL.

Referring to FIG. 22A, cell strings may include intermediate switching transistors MST disposed in a lowest layer, and a memory cell array 700 may be divided into a first sub array 710 and a second sub array 720.

Referring to FIG. 22B, the cell strings may include switching transistors MST disposed in a lowest layer and an intermediate layer, and a memory cell array 800 may be divided into a first sub array 810, a second sub array 820, a third sub array 830 and a fourth sub array 840.

The program voltage disturbance and the pass voltage disturbance may be reduced by applying the above-described double boosting to the sub arrays considered as the above-described stacks and thus performance and lifetime of the nonvolatile memory device may be enhanced.

Figure 23:
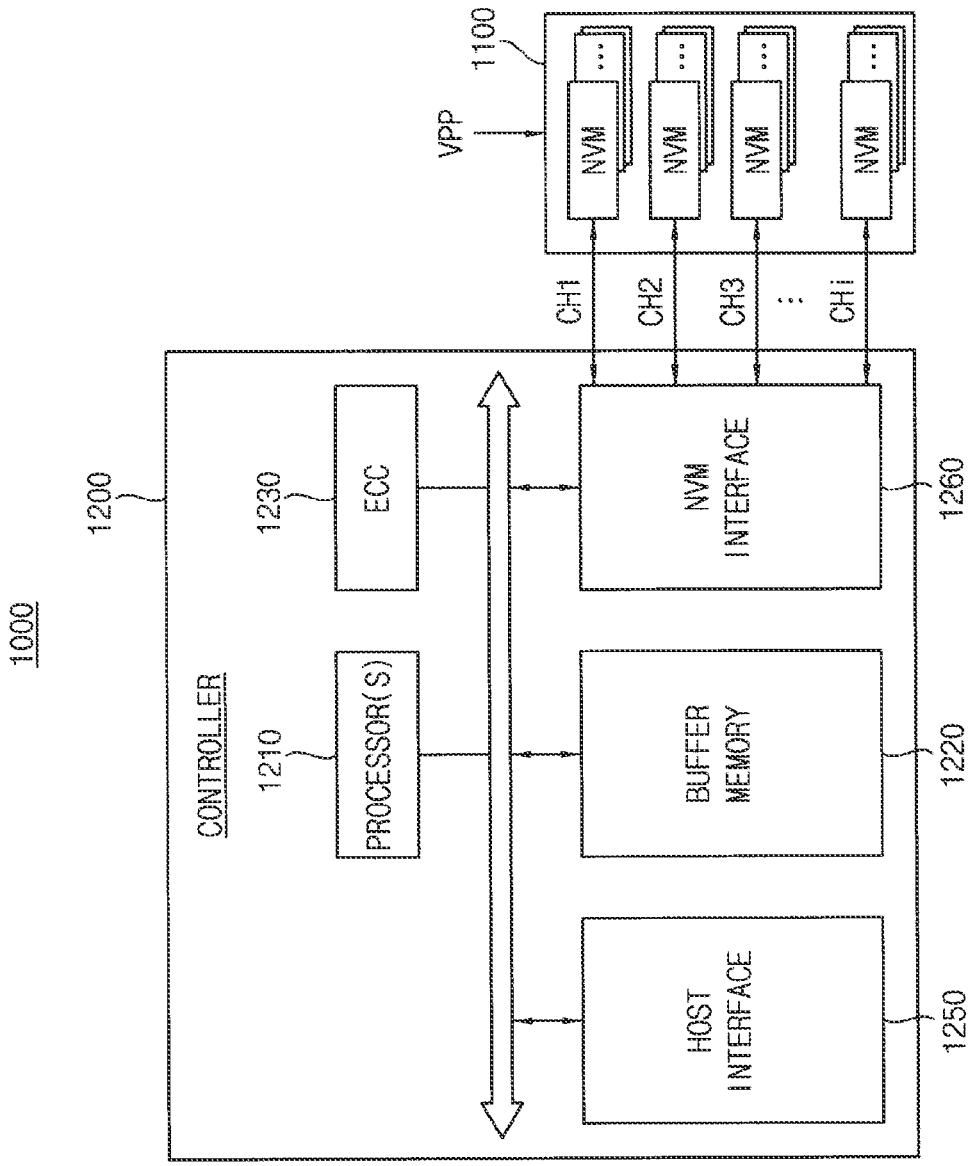
FIG. 23 is a block diagram illustrating a solid state disk or solid state drive (SSD) according to example embodiments.

FIG. 23 is a block diagram illustrating a solid state disk or solid state drive (SSD) according to embodiments.

Referring to FIG. 23, an SSD 1000 includes multiple nonvolatile memory devices 1100 and an SSD controller 1200.

The nonvolatile memory devices 1100 may be configured optionally to receive a high voltage VPP. The nonvolatile memory devices 1100 may be the above-described nonvolatile memory device 30. The nonvolatile memory devices 1100 may implement the double boosting as described above by controlling the switching operation of the intermediate switching transistors based on the program address.

The SSD controller 1200 is connected to the nonvolatile memory devices 1100 through multiple channels CH1 to CHi. The SSD controller 1200 includes one or more processors 1210, a buffer memory 1220, an error correction code (ECC) circuit 1230, a host interface 1250, and a nonvolatile memory interface 1260. The buffer memory 1220 stores data used to drive the SSD controller 1200. The buffer memory 1220 may buffer data for the program operation. The ECC circuit 1230 calculates error correction code values of data to be programmed at a writing operation and corrects an error of read data using an error correction code value at a read operation. In a data recovery operation, The ECC circuit 1230 corrects an error of data recovered from the nonvolatile memory devices 1100.

Figure 24:
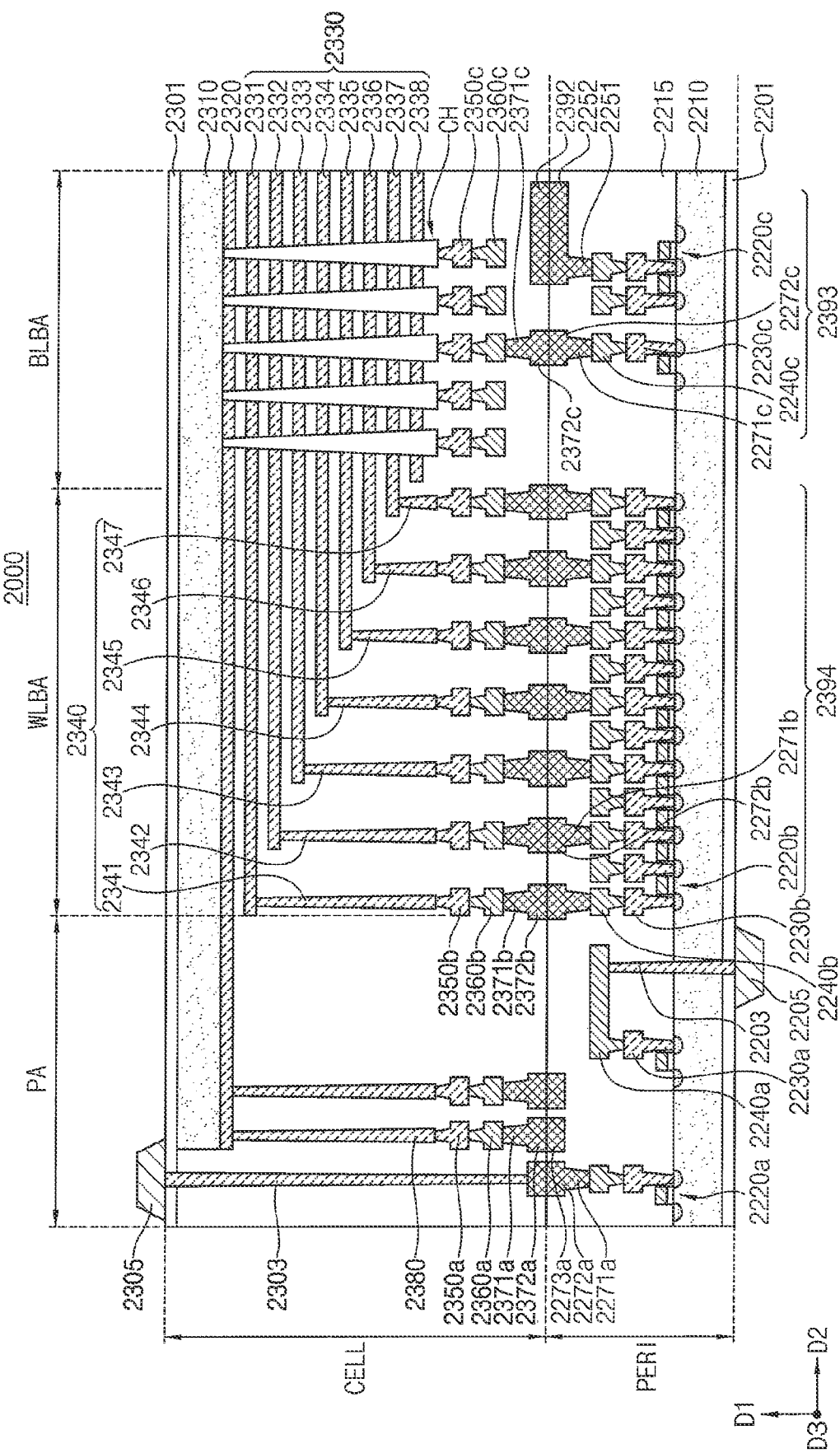
FIG. 24 is a cross-sectional view of a nonvolatile memory device according to example embodiments.

FIG. 24 is a cross-sectional view of a nonvolatile memory device according to example embodiments.

Referring to FIG. 24, a nonvolatile memory device or a memory device 2000 may have a chip-to-chip (C2C) structure. The C2C structure may refer to a structure formed by manufacturing an upper chip including a memory cell region or a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 2000 may include an external pad bonding area PA, a wordline bonding area WLBA, and a bitline bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an example embodiment, the first metal layers 2230a, 2230b, and 2230c may be formed of tungsten having relatively high resistance, and the second metal layers 2240a, 2240b, and 2240c may be formed of copper having relatively low resistance.

In an example embodiment illustrated in FIG. 24, although the first metal layers 2230a, 2230b, and 2230c and the second metal layers 2240a, 2240b, and 2240c are shown and described, they are not limited thereto, and one or more metal layers may be further formed on the second metal layers 2240a, 2240b, and 2240c. At least a portion of the one or more metal layers formed on the second metal layers 2240a, 2240b, and 2240c may be formed of aluminum or the like having a lower resistance than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the wordline bonding area WLBA. In the wordline bonding area WLBA, the lower bonding metals 2271b and 2272b in the peripheral circuit region PERI may be electrically connected to upper bonding metals 2371b and 2372b in the cell region CELL in a bonding manner, and the lower bonding metals 2271b and 2272b and the upper bonding metals 2371b and 2372b may be formed of aluminum, copper, tungsten, or the like. The upper bonding metals 2371b and 2372b in the cell region CELL may be referred as first metal pads and the lower bonding metals 2271b and 2272b in the peripheral circuit region PERI may be referred as second metal pads.

The cell region CELL may include at least one memory block. The cell region CELL may include a second substrate 2310 and a common source line 2320. On the second substrate 2310, a plurality of wordlines 2331, 2332, 2333, 2334, 2335, 2336, 2337, and 2338 (i.e., 2330) may be stacked in a first direction D1, perpendicular to an upper surface of the second substrate 2310. At least one string selection line and at least one ground selection line may be arranged on and below the plurality of wordlines 2330, respectively, and the plurality of wordlines 2330 may be disposed between the at least one string selection line and the at least one ground selection line.

In the bitline bonding area BLBA, a channel structure CH corresponding to a plurality of NAND strings may extend in the first direction D1, perpendicular to the upper surface of the second substrate 2310, and pass through the plurality of wordlines 2330, the at least one string selection line, and the at least one ground selection line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bitline contact, and the second metal layer 2360c may be a bitline. In an example embodiment, the bitline 2360c may extend in a third direction D3, parallel to the upper surface of the second substrate 2310.

In an example embodiment illustrated in FIG. 24, an area in which the channel structure CH, the bitline 2360c, and the like are disposed may be defined as the bitline bonding area BLBA. In the bitline bonding area BLBA, the bitline 2360c may be electrically connected to the circuit elements 2220c providing a page buffer 2393 in the peripheral circuit region PERI. For example, the bitline 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393. The upper bonding metals 2371c and 2372c may be referred to as the first bonding metals and the lower bonding metals 2271c and 2272c may be referred to as the second bonding metals.

In the wordline bonding area WLBA, the plurality of wordlines 2330 may extend in a second direction D2, parallel to the upper surface of the second substrate 2310, and may be connected to a plurality of cell contact plugs 2341, 2342, 2343, 2344, 2345, 2346, and 2347 (i.e., 2340). The plurality of wordlines 2330 and the plurality of cell contact plugs 2340 may be connected to each other in pads provided by at least a portion of the plurality of wordlines 2330 extending in different lengths in the second direction D2. A first metal layer 2350b and a second metal layer 2360b may be connected to an upper portion of the plurality of cell contact plugs 2340 connected to the plurality of wordlines 2330, sequentially. The plurality of cell contact plugs 2340 may be connected to the circuit region PERI by the upper bonding metals 2371b and 2372b of the cell region CELL and the lower bonding metals 2271b and 2272b of the peripheral circuit region PERI in the wordline bonding area WLBA.

The plurality of cell contact plugs 2340 may be electrically connected to the circuit elements 2220b providing a row decoder 2394 in the peripheral circuit region PERI. In an example embodiment, operating voltages of the circuit elements 2220b providing the row decoder 2394 may be different than operating voltages of the circuit elements 2220c providing the page buffer 2393. For example, operating voltages of the circuit elements 2220c providing the page buffer 2393 may be greater than operating voltages of the circuit elements 2220b providing the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220a, 2220b, and 2220c disposed in the peripheral circuit region PERI through a first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310, and a second input/output pad 2305 may be disposed on the upper insulating layer 2301. The second input/output pad 2305 may be connected to at least one of the plurality of circuit elements 2220a, 2220b, and 2220c disposed in the peripheral circuit region PERI through a second input/output contact plug 2303.

According to embodiments, the second substrate 2310 and the common source line 2320 may not be disposed in an area in which the second input/output contact plug 2303 is disposed. Also, the second input/output pad 2305 may not overlap the wordlines 2330 in the first direction D1. The second input/output contact plug 2303 may be separated from the second substrate 2310 in the direction, parallel to the upper surface of the second substrate 310, and may pass through the interlayer insulating layer 2315 of the cell region CELL to be connected to the second input/output pad 2305.

According to embodiments, the first input/output pad 2205 and the second input/output pad 2305 may be selectively formed. For example, the memory device 2000 may include only the first input/output pad 2205 disposed on the first substrate 2210 or the second input/output pad 2305 disposed on the second substrate 2310. Alternatively, the memory device 200 may include both the first input/output pad 2205 and the second input/output pad 2305.

A metal pattern in an uppermost metal layer may be provided as a dummy pattern or the uppermost metal layer may be absent, in each of the external pad bonding area PA and the bitline bonding area BLBA, respectively included in the cell region CELL and the peripheral circuit region PERI.

In the external pad bonding area PA, the nonvolatile memory device 2000 may include a lower metal pattern 2273a, corresponding to an upper metal pattern 2372a formed in an uppermost metal layer of the cell region CELL, and having the same shape as the upper metal pattern 2372a of the cell region CELL, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 2271b and 2272b may be formed on the second metal layer 2240b in the wordline bonding area WLBA. In the wordline bonding area WLBA, the lower bonding metals 2271b and 2272b of the peripheral circuit region PERI may be electrically connected to the upper bonding metals 2371b and 2372b of the cell region CELL by a Cu—Cu bonding.

Further, the bitline bonding area BLBA, an upper metal pattern 2392, corresponding to a lower metal pattern 2252 formed in the uppermost metal layer of the peripheral circuit region PERI, and having the same shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

As described above, a plurality of intermediate switching transistors may be disposed in a boundary portion between two adjacent stacks of a memory block in the vertical direction D1 to perform the method of programming in the nonvolatile memory device 2000. The memory block including the stacks may be formed in the memory cell region CEE, and the control circuit as described above may be formed in the peripheral circuit region PERI.

As described above, the nonvolatile memory device and the method of programming in the nonvolatile memory device according to embodiments may reduce program voltage disturbance and pass voltage disturbance, and thus, may enhance performance and lifetime of the nonvolatile memory device through control of the switching operation of the intermediate switching transistors to implement double boosting of the channel voltages.

The present inventive concept may be applied to nonvolatile memory devices and systems including the nonvolatile memory device. For example, the present inventive concept may be applied to systems such as be a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

The foregoing is illustrative of embodiments and is not to be construed as limiting thereof. Although various embodiments have been described, those skilled in the art will readily appreciate that many modifications are possible in the embodiments without materially departing from the inventive concept.

What is claimed is:

1. A method of programming a memory block comprising a plurality of stacks connected in series in a vertical direction by forming a plurality of cell strings between a plurality of bitlines and a source line, the method comprising:
    determining, from among the plurality of stacks, a first stack comprising memory cells to be programmed, the first stack being separated from a second stack by a boundary portion comprising a plurality of intermediate switching transistors;
    during a first period, applying a turn-on voltage to gate electrodes of the plurality of intermediate switching transistors;
    during the first period, applying a first pass voltage to wordlines of the second stack;
    during a second period after the first period, applying a turn-off voltage to the gate electrodes of the plurality of intermediate switching transistors while maintaining the first pass voltage applied to the wordlines of the second stack;
    during the second period, applying a second pass voltage to wordlines of the first stack; and
    during a program execution period after the second period, applying a program voltage to a selected wordline of the first stack.

2. The method of claim 1, further comprising:
    during the first period, applying an initialization voltage to the wordlines of the first stack.

3. The method of claim 1, further comprising:
    performing a program scenario such that a program operation is performed in a downward direction from an uppermost wordline;
    during a precharge period before the first period, applying a precharge voltage to the source line; and
    during the precharge period, applying a turn-on voltage to gate electrodes of ground selection transistors included in the plurality of cell strings.

4. The method of claim 1, further comprising:
performing a program scenario such that a program operation is performed in an upward direction from a lowest wordline;
during a precharge period before the first period, applying a precharge voltage to the plurality of bitlines; and
during the precharge period, applying a turn-on voltage to gate electrodes of string selection transistors included in the plurality of cell strings.

5. The method of claim 1, further comprising:
during the program execution period, applying a program inhibition voltage or a program permission voltage to each of the plurality of bitlines according to program data;
during the program execution period, electrically connecting a selected cell string to a corresponding bitline; and
during the program execution period, electrically disconnecting an unselected cell string from a corresponding bitline.

6. The method of claim 1, further comprising:
during the first period, the second period and the program execution period, electrically disconnecting the plurality of cell strings from the source line.

7. The method of claim 1, further comprising:
during a first recovery period after the program execution period, decreasing voltages of the wordlines of the first stack from the second pass voltage to an intermediate voltage lower than the second pass voltage and higher than an initialization voltage; and
during the first recovery period, turning on the plurality of intermediate switching transistors.

8. The method of claim 7, further comprising:
during a second recovery period after the first recovery period, decreasing voltages of the wordlines of the second stack from the first pass voltage to the initialization voltage, and, at a substantially same time, decreasing the voltages of the wordlines of the first stack from the intermediate voltage to the initialization voltage.

9. The method of claim 1, wherein the first stack is above the boundary portion and the second stack is below the boundary portion.

10. The method of claim 9, further comprising:
performing a program scenario such that a program operation is performed in a downward direction from an uppermost wordline,
wherein the second stack corresponds to an erased stack and the first stack corresponds to a selected stack corresponding to a program command.

11. The method of claim 1, wherein the first stack is below the boundary portion and the second stack is above the boundary portion.

12. The method of claim 11, further comprising:
performing a program scenario such that a program operation is performed in an upward direction from a lowest wordline,
wherein the second stack corresponds to an erased stack and the first stack corresponds to a selected stack corresponding to a program command.

13. The method of claim 1, further comprising:
controlling a boosting operation during the first period and the second period based on a program line number corresponding to a number of wordlines connected to memory cells previously programmed in the first stack.

14. The method of claim 13, wherein the controlling the boosting operation comprises:

performing the boosting operation in response to determining that the program line number is smaller than a reference number; and
omitting the boosting operation in response to determining that the program line number is greater than the reference number.

15. The method of claim 13, wherein the controlling the boosting operation comprises:
decreasing the first pass voltage as the program line number increases.

16. The method of claim 13, wherein the performing the boosting operation further comprises:
before the first pass voltage is applied to the wordlines of the second stack, applying a precharge voltage to channels of the first stack and channels of the second stack while the plurality of intermediate switching transistors are turned on, and
wherein the controlling the boosting operation comprises:
decreasing the precharge voltage as the program line number increases.

17. A method of programming a memory block comprising a plurality of stacks connected in series in a vertical direction by forming a plurality of cell strings between a plurality of bitlines and a source line, the method comprising:
determining, from among the plurality of stacks, a first stack comprising memory cells to be programmed, the first stack being separated from a second stack by a boundary portion comprising a plurality of intermediate switching transistors;
during a first period and a second period, applying a first pass voltage to wordlines of the second stack;
during the first period and the second period, applying a second pass voltage to wordlines of the first stack;
during the second period after the first period, applying a turn-off voltage to gate electrodes of the plurality of intermediate switching transistors while maintaining the first pass voltage applied to the wordlines of the second stack; and
during a program execution period after the second period, applying a program voltage to a selected wordline of the first stack.

18. The method of claim 17, wherein the second pass voltage is higher than the first pass voltage.

19. A method of programming a memory block comprising a plurality of stacks connected in series in a vertical direction by forming a plurality of cell strings between a plurality of bitlines and a source line, the method comprising:
determining, from among the plurality of stacks, a first stack comprising memory cells to be programmed, the first stack being separated from a second stack by a boundary portion comprising a plurality of intermediate switching transistors;
during a first period, applying a turn-on voltage to gate electrodes of the plurality of intermediate switching transistors;
during the first period, applying a first pass voltage to wordlines of the second stack;
during a second period after the first period, applying a turn-off voltage to the gate electrodes of the plurality of intermediate switching transistors while maintaining the first pass voltage applied to the wordlines of the second stack;
during the second period, applying a second pass voltage to the wordlines of the first stack; and during a program execution period after the second period, applying a program voltage to a selected word-line of the first stack.

20. The method of claim 19, wherein the second pass voltage is lower than the first pass voltage.

* * * * *